(12) United States Patent
Khesbak et al.

(10) Patent No.: US 12,301,185 B2
(45) Date of Patent: *May 13, 2025

(54) APPARATUS AND METHODS FOR ADAPTIVE POWER AMPLIFIER BIASING

(71) Applicant: Skyworks Solutions, Inc., Irvine, CA (US)

(72) Inventors: Sabah Khesbak, Irvine, CA (US); Florinel G. Balteanu, Irvine, CA (US); Roman Zbigniew Arkiszewski, Oak Ridge, NC (US); Jeffrey Gordon Strahler, Greensboro, NC (US)

(73) Assignee: Skyworks Solutions, Inc., Irvine, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 18/442,884

(22) Filed: Feb. 15, 2024

(65) Prior Publication Data
US 2024/0186964 A1    Jun. 6, 2024

Related U.S. Application Data

(63) Continuation of application No. 17/653,164, filed on Mar. 2, 2022, now Pat. No. 11,942,910, which is a continuation of application No. 16/947,097, filed on Jul. 17, 2020, now Pat. No. 11,303,255.

(60) Provisional application No. 62/876,897, filed on Jul. 22, 2019.

(51) Int. Cl.
*H03G 3/20* (2006.01)
*H03F 3/195* (2006.01)
*H03F 3/24* (2006.01)

(52) U.S. Cl.
CPC ............. *H03F 3/245* (2013.01); *H03F 3/195* (2013.01); *H03F 2200/105* (2013.01); *H03F 2200/165* (2013.01); *H03F 2200/451* (2013.01)

(58) Field of Classification Search
CPC ........................................................ H03G 3/20
USPC .................................................. 330/129, 136
See application file for complete search history.

(56) References Cited

U.S. PATENT DOCUMENTS

| | | |
|---|---|---|
| 6,339,361 B1 | 1/2002 | Khesbak et al. |
| 6,438,365 B1 | 8/2002 | Balteanu |
| 6,542,029 B1 | 4/2003 | Khesbak et al. |
| 6,704,560 B1 | 3/2004 | Balteanu et al. |
| 6,977,976 B1 | 12/2005 | Birkett et al. |
| 7,496,339 B2 | 2/2009 | Balteanu et al. |
| 8,140,028 B2 | 3/2012 | Balteanu et al. |
| 8,351,873 B2 | 1/2013 | Balteanu et al. |
| 8,587,377 B2 | 11/2013 | Khesbak et al. |
| 8,598,950 B2 | 12/2013 | Khesbak |
| 8,669,811 B2 | 3/2014 | Le Gallou et al. |
| 8,718,188 B2 | 5/2014 | Balteanu et al. |

(Continued)

*Primary Examiner* — Henry Choe
(74) *Attorney, Agent, or Firm* — Knobbe, Martens, Olson & Bear, LLP

(57) ABSTRACT

Apparatus and methods for adaptive power amplifier biasing are provided. In certain embodiments, a power amplifier system includes a power amplifier that provides amplification to a radio frequency (RF) signal, and a power amplifier bias control circuit that generates a bias signal of the power amplifier based on a bandwidth signal indicating a bandwidth of the RF signal. The power amplifier bias control circuit has a bandwidth that adapts to the bandwidth of the RF signal as indicated by the bandwidth signal.

17 Claims, 19 Drawing Sheets

(56) References Cited

U.S. PATENT DOCUMENTS

| | | |
|---|---|---|
| 8,786,371 B2 | 7/2014 | Popplewell et al. |
| 8,981,847 B2 | 3/2015 | Balteanu |
| 8,989,682 B2 | 3/2015 | Ripley et al. |
| 9,083,282 B2 | 7/2015 | Zhang et al. |
| 9,083,455 B2 | 7/2015 | Popplewell et al. |
| 9,092,393 B2 | 7/2015 | Whitefield et al. |
| 9,118,277 B2 | 8/2015 | Balteanu et al. |
| 9,143,096 B2 | 9/2015 | Balteanu et al. |
| 9,189,430 B2 | 11/2015 | Ross et al. |
| 9,197,128 B2 | 11/2015 | Popplewell et al. |
| 9,231,533 B2 | 1/2016 | Zhang et al. |
| 9,257,940 B2 | 2/2016 | Khesbak |
| 9,294,043 B2 | 3/2016 | Ripley et al. |
| 9,294,054 B2 | 3/2016 | Balteanu et al. |
| 9,331,653 B2 | 5/2016 | Khesbak et al. |
| 9,374,039 B2 * | 6/2016 | Kamitani ................. H03F 3/19 |
| 9,391,648 B2 | 7/2016 | Popplewell et al. |
| 9,425,833 B2 | 8/2016 | Popplewell et al. |
| 9,445,371 B2 | 9/2016 | Khesbak et al. |
| 9,455,669 B2 | 9/2016 | Modi et al. |
| 9,548,702 B2 | 1/2017 | Khesbak |
| 9,571,049 B2 | 2/2017 | Zhang et al. |
| 9,571,152 B2 | 2/2017 | Ripley et al. |
| 9,584,070 B2 | 2/2017 | Balteanu et al. |
| 9,588,529 B2 | 3/2017 | Balteanu et al. |
| 9,595,923 B2 * | 3/2017 | Nobbe ................. H03F 1/3223 |
| 9,606,947 B2 | 3/2017 | Ross et al. |
| 9,621,111 B2 | 4/2017 | Khesbak et al. |
| 9,668,215 B2 | 5/2017 | Balteanu et al. |
| 9,673,707 B2 | 6/2017 | Popplewell et al. |
| 9,698,832 B2 | 7/2017 | Popplewell et al. |
| 9,774,300 B2 | 9/2017 | Jin et al. |
| 9,806,676 B2 | 10/2017 | Balteanu et al. |
| 9,831,834 B2 | 11/2017 | Balteanu et al. |
| 9,837,972 B2 | 12/2017 | Arkiszewski |
| 9,859,846 B2 | 1/2018 | Khesbak |
| 9,866,176 B2 | 1/2018 | Khesbak |
| 9,876,471 B2 | 1/2018 | Modi et al. |
| 9,876,473 B2 | 1/2018 | Khesbak et al. |
| 9,893,682 B2 | 2/2018 | Zhu et al. |
| 9,935,582 B2 | 4/2018 | Balteanu et al. |
| 9,948,241 B2 | 4/2018 | Popplewell et al. |
| 9,971,377 B2 | 5/2018 | Balteanu et al. |
| 9,973,088 B2 | 5/2018 | Balteanu et al. |
| 9,990,322 B2 | 6/2018 | Whitefield et al. |
| 9,991,856 B2 | 6/2018 | Khesbak et al. |
| 10,110,169 B2 * | 10/2018 | Khesbak ................. H03F 1/0227 |
| 11,303,255 B2 | 4/2022 | Khesbak et al. |
| 11,942,910 B2 | 3/2024 | Khesbak et al. |
| 2012/0129478 A1 | 5/2012 | Pierick et al. |
| 2016/0050665 A1 | 2/2016 | Chang et al. |
| 2017/0026060 A1 | 1/2017 | Thompson et al. |
| 2017/0026136 A1 | 1/2017 | Thompson et al. |
| 2017/0093505 A1 | 3/2017 | Ripley et al. |
| 2017/0131734 A1 | 5/2017 | Balteanu et al. |
| 2017/0195972 A1 | 7/2017 | Drogi et al. |
| 2017/0223632 A1 | 8/2017 | Balteanu et al. |
| 2017/0228332 A1 | 8/2017 | Ross et al. |
| 2017/0338773 A1 | 11/2017 | Balteanu et al. |
| 2018/0054172 A1 | 2/2018 | Khesbak et al. |
| 2018/0076772 A1 | 3/2018 | Khesbak et al. |
| 2018/0102581 A1 | 4/2018 | Jayaraman et al. |
| 2018/0138862 A1 | 5/2018 | Balteanu et al. |
| 2018/0152945 A1 | 5/2018 | Balteanu |
| 2018/0159476 A1 | 6/2018 | Balteanu et al. |
| 2018/0159478 A1 | 6/2018 | Balteanu et al. |
| 2018/0167037 A1 | 6/2018 | Zhu et al. |
| 2018/0226927 A1 | 8/2018 | Arkiszewski et al. |
| 2018/0234095 A1 | 8/2018 | Balteanu et al. |
| 2018/0278214 A1 | 9/2018 | Jin et al. |
| 2018/0287573 A1 | 10/2018 | Khesbak et al. |
| 2018/0294776 A1 | 10/2018 | Popplewell et al. |
| 2018/0302036 A1 | 10/2018 | Balteanu et al. |
| 2018/0331659 A1 | 11/2018 | Khesbak et al. |
| 2018/0351454 A1 | 12/2018 | Khesbak et al. |
| 2018/0375476 A1 | 12/2018 | Balteanu et al. |
| 2018/0375483 A1 | 12/2018 | Balteanu et al. |
| 2019/0020315 A1 | 1/2019 | Khesbak et al. |
| 2019/0028136 A1 | 1/2019 | Zhang et al. |
| 2019/0123690 A1 | 4/2019 | Balteanu et al. |
| 2019/0131684 A1 | 5/2019 | Jayaraman et al. |
| 2019/0165736 A1 | 5/2019 | Khesbak et al. |
| 2019/0190462 A1 | 6/2019 | Zhu et al. |
| 2019/0190548 A1 | 6/2019 | Chang et al. |
| 2019/0229621 A1 | 7/2019 | Balteanu et al. |
| 2019/0319720 A1 | 10/2019 | Ripley et al. |
| 2019/0334561 A1 | 10/2019 | Thompson et al. |
| 2019/0341888 A1 | 11/2019 | Drogi et al. |
| 2019/0372526 A1 | 12/2019 | Balteanu et al. |
| 2019/0372628 A1 | 12/2019 | Balteanu et al. |
| 2019/0379409 A1 | 12/2019 | Thompson et al. |
| 2020/0067406 A1 | 2/2020 | Khesbak et al. |
| 2020/0099343 A1 | 3/2020 | Khesbak et al. |
| 2020/0112300 A1 | 4/2020 | Balteanu et al. |
| 2020/0127619 A1 | 4/2020 | Khesbak et al. |
| 2020/0154434 A1 | 5/2020 | Balteanu |
| 2020/0162028 A1 | 5/2020 | Balteanu et al. |
| 2020/0162030 A1 | 5/2020 | Drogi et al. |
| 2020/0162229 A1 | 5/2020 | Chang et al. |
| 2020/0259458 A1 | 8/2020 | Balteanu et al. |
| 2020/0259459 A1 | 8/2020 | Balteanu et al. |
| 2020/0335844 A1 | 10/2020 | Jayaraman et al. |
| 2020/0336110 A1 | 10/2020 | Drogi et al. |

\* cited by examiner

APPARATUS AND METHODS FOR ADAPTIVE POWER AMPLIFIER BIASING

CROSS-REFERENCE TO RELATED APPLICATIONS

This application is a continuation of U.S. patent application Ser. No. 17/653,164, filed Mar. 2, 2022 and titled "APPARATUS AND METHODS FOR ADAPTIVE POWER AMPLIFIER BIASING," which is a continuation of U.S. patent application Ser. No. 16/947,097, filed Jul. 17, 2020 and titled "APPARATUS AND METHODS FOR ADAPTIVE POWER AMPLIFIER BIASING," which claims the benefit of priority under 35 U.S.C. § 119 of U.S. Provisional Patent Application No. 62/876,897, filed Jul. 22, 2019 and titled "APPARATUS AND METHODS FOR ADAPTIVE POWER AMPLIFIER BIASING," each of which is herein incorporated by reference in its entirety.

BACKGROUND

Field

Embodiments of the invention relate to electronic systems, and in particular, to power amplifiers for radio frequency (RF) electronics.

Description of the Related Technology

Power amplifiers are used in radio frequency (RF) communication systems to amplify RF signals for transmission via antennas. It can be important to manage the power of RF signal transmissions to prolong battery life and/or provide a suitable transmit power level.

Examples of RF communication systems with one or more power amplifiers include, but are not limited to mobile phones, tablets, base stations, network access points, laptops, and wearable electronics. Power amplifiers provide amplification to RF signals, which can have a frequency in the range from about 30 kHz to 300 GHz, such as in the range of about 410 MHz to about 7.125 GHz for fifth generation (5G) communications using Frequency Range 1 (FR1).

SUMMARY

In certain embodiments, a power amplifier system includes a power amplifier configured to provide amplification to a radio frequency signal, and a power amplifier bias control circuit configured to generate a bias signal of the power amplifier based on a bandwidth signal indicating a bandwidth of the radio frequency signal. Additionally, the power amplifier bias control circuit has a bandwidth that adapts to the bandwidth of the radio frequency signal as indicated by the bandwidth signal.

In various embodiments, the bandwidth of the power amplifier bias control circuit is configured to widen in response to the bandwidth signal indicating an increase in the bandwidth of the radio frequency signal. According to several embodiments, the bandwidth of the power amplifier bias control circuit is configured to narrow in response to the bandwidth signal indicating a decrease in the bandwidth of the radio frequency signal.

In some embodiments, the power amplifier bias control circuit includes a bias circuit configured to generate a bias input signal, and a controllable filter configured to generate the bias signal of the power amplifier based on filtering the bias input signal, the controllable filter controlled by the bandwidth signal.

In several embodiments, the power amplifier bias control circuit is configured to receive the bandwidth signal as digital data over a serial interface.

In various embodiments, the power amplifier system further includes a detector configured to generate the bandwidth signal based on detecting the bandwidth of the radio frequency signal. According to a number of embodiments, the detector includes a radio frequency to baseband detection circuit configured to generate a baseband detection signal based on the radio frequency signal, and a bandwidth extractor configured to generate the bandwidth signal based on the baseband detection signal.

In accordance with several embodiments, the radio frequency to baseband detection circuit includes a root mean square detector configured to generate the baseband detection signal to indicate a root mean square value of the radio frequency signal. According to some embodiments, the bandwidth detection circuit is configured to process the baseband detection signal to generate a high pass detection signal and a low pass detection signal, and to generate the bandwidth signal based on comparing a number of zero crossing of the high pass detection signal to a number of zero crossings of the low pass detection signal. In accordance with several embodiments, the power amplifier system further includes a detection signal linearization circuit configured to linearize the bandwidth signal. According to a number of embodiments, the detection signal linearization circuit includes a cascade of a plurality of converter cells, and the bandwidth signal is based on a sum of a plurality of currents generated by the plurality of converter cells in response to the baseband detection signal.

In several embodiments, the detector is configured to generate the bandwidth signal based on detecting a number of resource blocks used by the radio frequency signal. According to a number of embodiments, the power amplifier system further includes a directional coupler configured to receive the radio frequency signal and to provide a coupled signal to an input of the detector.

In certain embodiments, the present disclosure relates to a mobile device. The mobile device includes a transceiver configured to generate a radio frequency input signal, an antenna configured to transmit a radio frequency output signal, and a front end system including a power amplifier configured to amplify the radio frequency input signal to generate the radio frequency output signal, and a power amplifier bias control circuit configured to generate a bias signal of the power amplifier based on a bandwidth signal indicating a bandwidth of the radio frequency input signal. The power amplifier bias control circuit has a bandwidth that adapts to the bandwidth of the radio input frequency signal.

In various embodiments, the bandwidth of the power amplifier bias control circuit is configured to widen in response to the bandwidth signal indicating an increase in the bandwidth of the radio frequency input signal. According to a number of embodiments, the bandwidth of the power amplifier bias control circuit is configured to narrow in response to the bandwidth signal indicating a decrease in the bandwidth of the radio frequency signal.

In several embodiments, the power amplifier bias control circuit includes a bias circuit configured to generate a bias input signal, and a controllable filter configured to generate the bias signal of the power amplifier based on filtering the bias input signal, the controllable filter controlled by the bandwidth signal. According to a number of embodiments, the mobile device further includes a battery that provides a battery voltage to the bias circuit.

In various embodiments, the mobile device further includes a baseband processor connected to the front end system over a serial interface, the power amplifier bias control circuit configured to receive the bandwidth signal as digital data over the serial interface.

In some embodiments, the front end system further includes a detector configured to generate the bandwidth signal based on detecting the bandwidth of the radio frequency input signal. According to a number of embodiments, the detector includes a radio frequency to baseband detection circuit configured to generate a baseband detection signal based on the radio frequency input signal, and a bandwidth extractor configured to generate the bandwidth signal based on the baseband detection signal.

In several embodiments, the radio frequency to baseband detection circuit includes a root mean square detector configured to generate the baseband detection signal to indicate a root mean square value of the radio frequency input signal. According to a number of embodiments, the bandwidth detection circuit is configured to process the baseband detection signal to generate a high pass detection signal and a low pass detection signal, and to generate the bandwidth signal based on comparing a number of zero crossing of the high pass detection signal to a number of zero crossings of the low pass detection signal.

In various embodiments, the mobile device further including a detection signal linearization circuit configured to linearize the bandwidth signal. According to a number of embodiments, the detection signal linearization circuit includes a cascade of a plurality of converter cells, the bandwidth signal based on a sum of a plurality of currents generated by the plurality of converter cells in response to the baseband detection signal.

In some embodiments, the detector is configured to generate the bandwidth signal based on detecting a number of resource blocks used by the radio frequency input signal.

In a number of embodiments, the front end system further includes a directional coupler configured to receive the radio frequency input signal and to provide a coupled signal to an input of the detector.

In certain embodiments, the present disclosure relates to a method of power amplifier biasing. The method including amplifying a radio frequency signal using a power amplifier, biasing the power amplifier with a bias signal using a power amplifier bias control circuit, and controlling the bias signal based on a bandwidth signal using the power amplifier bias control circuit, including adapting a bandwidth of the power amplifier bias control circuit to a bandwidth of the radio frequency signal indicated by the bandwidth signal.

In some embodiments, controlling the bias signal further includes widening the bandwidth of the power amplifier bias control circuit in response to the bandwidth signal indicating an increase in the bandwidth of the radio frequency signal. According to a number of embodiments, controlling the bias signal further includes narrowing the bandwidth of the power amplifier bias control circuit in response to the bandwidth signal indicating a decrease in the bandwidth of the radio frequency signal.

In various embodiments, controlling the bias signal further includes generating a bias input signal using a bias circuit, controlling a filter characteristic of a controllable filter using the bandwidth signal, and generating the bias signal based on filtering the bias input signal using the controllable filter.

In a number of embodiments, the method further includes receiving the bandwidth signal as digital data over a serial interface.

In several embodiments, the method further includes generating the bandwidth signal based on detecting the bandwidth of the radio frequency signal using a detector. According to some embodiments, generating the bandwidth signal includes generating a baseband detection signal from the radio frequency signal using a radio frequency to baseband detection circuit, and generating the bandwidth signal based on the baseband detection signal using a bandwidth extractor.

In a number of embodiments, generating the bandwidth signal further includes generating the baseband detection signal to indicate a root mean square value of the radio frequency signal.

In various embodiments, generating the bandwidth signal further includes processing the baseband detection signal to generate a high pass detection signal and a low pass detection signal, and comparing a number of zero crossing of the high pass detection signal to a number of zero crossings of the low pass detection signal.

In several embodiments, the method further includes linearizing the bandwidth signal using a detection signal linearization circuit.

In some embodiments, generating the bandwidth signal further includes detecting a number of resource blocks used by the radio frequency signal.

In a number of embodiments, generating a coupled signal from the radio frequency signal using a directional coupler, and providing the coupled signal to an input of the detector.

DETAILED DESCRIPTION OF EMBODIMENTS

Figure 1:
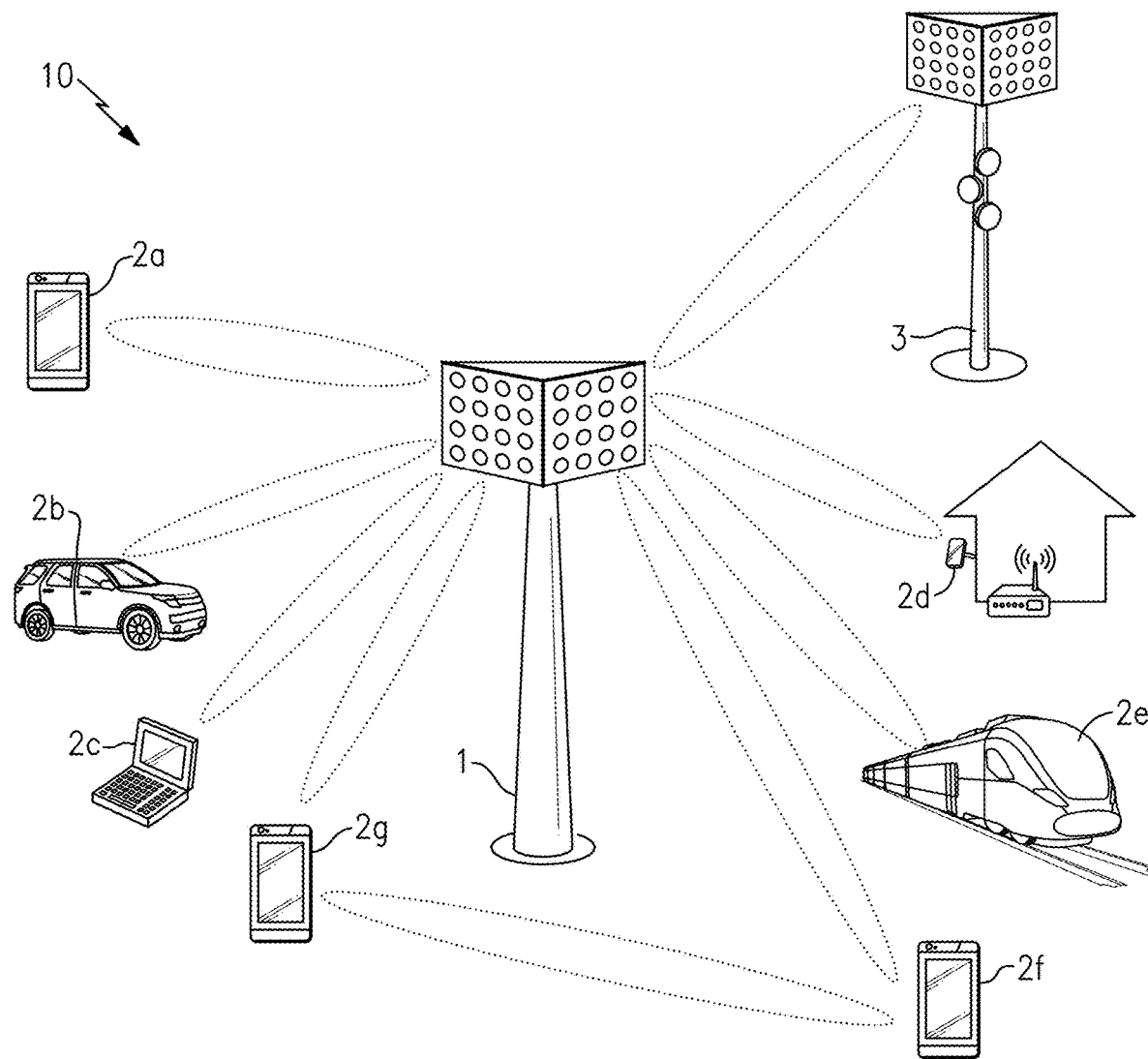
FIG. 1 is a schematic diagram of one example of a communication network.

The following detailed description of certain embodiments presents various descriptions of specific embodiments. However, the innovations described herein can be embodied in a multitude of different ways, for example, as defined and covered by the claims. In this description, reference is made to the drawings where like reference numerals can indicate identical or functionally similar elements. It will be understood that elements illustrated in the figures are not necessarily drawn to scale. Moreover, it will be understood that certain embodiments can include more elements than illustrated in a drawing and/or a subset of the elements illustrated in a drawing. Further, some embodiments can incorporate any suitable combination of features from two or more drawings.

FIG. 1 is a schematic diagram of one example of a communication network 10. The communication network 10 includes a macro cell base station 1, a small cell base station 3, and various examples of user equipment (UE), including a first mobile device 2a, a wireless-connected car 2b, a laptop 2c, a stationary wireless device 2d, a wireless-connected train 2e, a second mobile device 2f, and a third mobile device 2g.

Although specific examples of base stations and user equipment are illustrated in FIG. 1, a communication network can include base stations and user equipment of a wide variety of types and/or numbers.

For instance, in the example shown, the communication network 10 includes the macro cell base station 1 and the small cell base station 3. The small cell base station 3 can operate with relatively lower power, shorter range, and/or with fewer concurrent users relative to the macro cell base station 1. The small cell base station 3 can also be referred to as a femtocell, a picocell, or a microcell. Although the communication network 10 is illustrated as including two base stations, the communication network 10 can be implemented to include more or fewer base stations and/or base stations of other types.

Although various examples of user equipment are shown, the teachings herein are applicable to a wide variety of user equipment, including, but not limited to, mobile phones, tablets, laptops, IoT devices, wearable electronics, customer premises equipment (CPE), wireless-connected vehicles, wireless relays, and/or a wide variety of other communication devices. Furthermore, user equipment includes not only currently available communication devices that operate in a cellular network, but also subsequently developed communication devices that will be readily implementable with the inventive systems, processes, methods, and devices as described and claimed herein.

The illustrated communication network 10 of FIG. 1 supports communications using a variety of cellular technologies, including, for example, 4G LTE and 5G NR. In certain implementations, the communication network 10 is further adapted to provide a wireless local area network (WLAN), such as WiFi. Although various examples of communication technologies have been provided, the communication network 10 can be adapted to support a wide variety of communication technologies.

Various communication links of the communication network 10 have been depicted in FIG. 1. The communication links can be duplexed in a wide variety of ways, including, for example, using frequency-division duplexing (FDD) and/or time-division duplexing (TDD). FDD is a type of radio frequency communications that uses different frequencies for transmitting and receiving signals. FDD can provide a number of advantages, such as high data rates and low latency. In contrast, TDD is a type of radio frequency communications that uses about the same frequency for transmitting and receiving signals, and in which transmit and receive communications are switched in time. TDD can provide a number of advantages, such as efficient use of spectrum and variable allocation of throughput between transmit and receive directions.

In certain implementations, user equipment can communicate with a base station using one or more of 4G LTE, 5G NR, and WiFi technologies. In certain implementations, enhanced license assisted access (eLAA) is used to aggregate one or more licensed frequency carriers (for instance, licensed 4G LTE and/or 5G NR frequencies), with one or more unlicensed carriers (for instance, unlicensed WiFi frequencies).

As shown in FIG. 1, the communication links include not only communication links between UE and base stations, but also UE to UE communications and base station to base station communications. For example, the communication network 10 can be implemented to support self-fronthaul and/or self-backhaul (for instance, as between mobile device 2g and mobile device 2f).

The communication links can operate over a wide variety of frequencies. In certain implementations, communications are supported using 5G NR technology over one or more frequency bands that are less than 6 Gigahertz (GHz) and/or over one or more frequency bands that are greater than 6 GHz. For example, the communication links can serve Frequency Range 1 (FR1), Frequency Range 2 (FR2), or a combination thereof. In one embodiment, one or more of the mobile devices support a HPUE power class specification.

In certain implementations, a base station and/or user equipment communicates using beamforming. For example, beamforming can be used to focus signal strength to overcome path losses, such as high loss associated with communicating over high signal frequencies. In certain embodiments, user equipment, such as one or more mobile phones, communicate using beamforming on millimeter wave frequency bands in the range of 30 GHz to 300 GHz and/or upper centimeter wave frequencies in the range of 6 GHz to 30 GHz, or more particularly, 24 GHz to 30 GHz.

Different users of the communication network 10 can share available network resources, such as available frequency spectrum, in a wide variety of ways.

In one example, frequency division multiple access (FDMA) is used to divide a frequency band into multiple frequency carriers. Additionally, one or more carriers are allocated to a particular user. Examples of FDMA include, but are not limited to, single carrier FDMA (SC-FDMA) and orthogonal FDMA (OFDMA). OFDMA is a multicarrier technology that subdivides the available bandwidth into multiple mutually orthogonal narrowband subcarriers, which can be separately assigned to different users.

Other examples of shared access include, but are not limited to, time division multiple access (TDMA) in which a user is allocated particular time slots for using a frequency resource, code division multiple access (CDMA) in which a frequency resource is shared amongst different users by assigning each user a unique code, space-divisional multiple access (SDMA) in which beamforming is used to provide shared access by spatial division, and non-orthogonal multiple access (NOMA) in which the power domain is used for multiple access. For example, NOMA can be used to serve multiple users at the same frequency, time, and/or code, but with different power levels.

Enhanced mobile broadband (eMBB) refers to technology for growing system capacity of LTE networks. For example, eMBB can refer to communications with a peak data rate of at least 10 Gbps and a minimum of 100 Mbps for each user. Ultra-reliable low latency communications (uRLLC) refers to technology for communication with very low latency, for instance, less than 2 milliseconds. uRLLC can be used for mission-critical communications such as for autonomous driving and/or remote surgery applications. Massive machine-type communications (mMTC) refers to low cost and low data rate communications associated with wireless connections to everyday objects, such as those associated with Internet of Things (IoT) applications.

The communication network 10 of FIG. 1 can be used to support a wide variety of advanced communication features, including, but not limited to, eMBB, uRLLC, and/or mMTC.

Figure 2A:
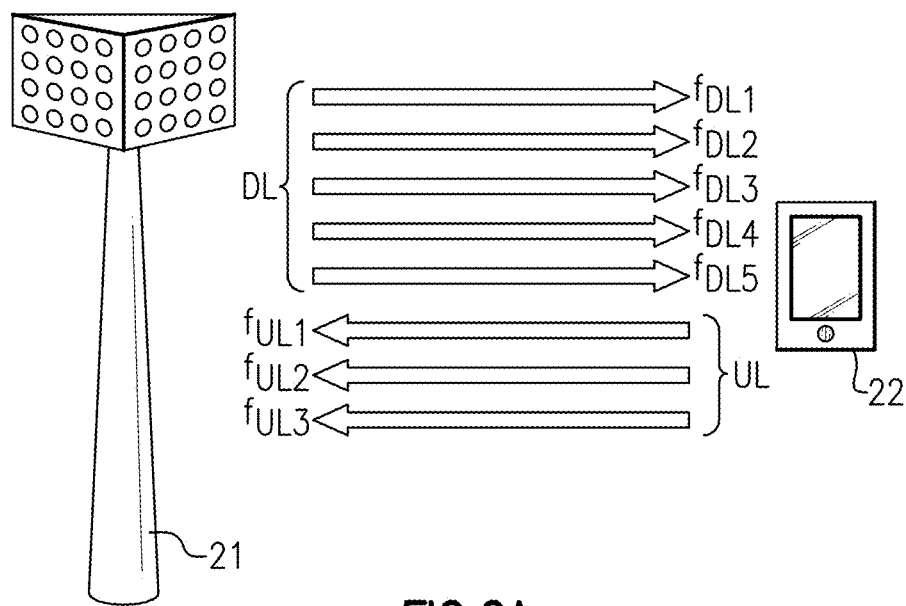
FIG. 2A is a schematic diagram of one example of a communication link using carrier aggregation.

FIG. 2A is a schematic diagram of one example of a communication link using carrier aggregation. Carrier aggregation can be used to widen bandwidth of the communication link by supporting communications over multiple frequency carriers, thereby increasing user data rates and enhancing network capacity by utilizing fragmented spectrum allocations.

In the illustrated example, the communication link is provided between a base station 21 and a mobile device 22. As shown in FIG. 2A, the communications link includes a downlink channel used for RF communications from the base station 21 to the mobile device 22, and an uplink channel used for RF communications from the mobile device 22 to the base station 21.

Although FIG. 2A illustrates carrier aggregation in the context of FDD communications, carrier aggregation can also be used for TDD communications.

In certain implementations, a communication link can provide asymmetrical data rates for a downlink channel and an uplink channel. For example, a communication link can be used to support a relatively high downlink data rate to enable high speed streaming of multimedia content to a mobile device, while providing a relatively slower data rate for uploading data from the mobile device to the cloud.

In the illustrated example, the base station 21 and the mobile device 22 communicate via carrier aggregation, which can be used to selectively increase bandwidth of the communication link. Carrier aggregation includes contiguous aggregation, in which contiguous carriers within the same operating frequency band are aggregated. Carrier aggregation can also be non-contiguous, and can include carriers separated in frequency within a common band or in different bands.

In the example shown in FIG. 2A, the uplink channel includes three aggregated component carriers $f_{UL1}$, $f_{UL2}$, and $f_{UL3}$. Additionally, the downlink channel includes five aggregated component carriers $f_{DL1}$, $f_{DL2}$, $f_{DL3}$, $f_{DL4}$, and $f_{DL5}$. Although one example of component carrier aggregation is shown, more or fewer carriers can be aggregated for uplink and/or downlink. Moreover, a number of aggregated carriers can be varied over time to achieve desired uplink and downlink data rates.

For example, a number of aggregated carriers for uplink and/or downlink communications with respect to a particular mobile device can change over time. For example, the number of aggregated carriers can change as the device moves through the communication network and/or as network usage changes over time.

Figure 2B:
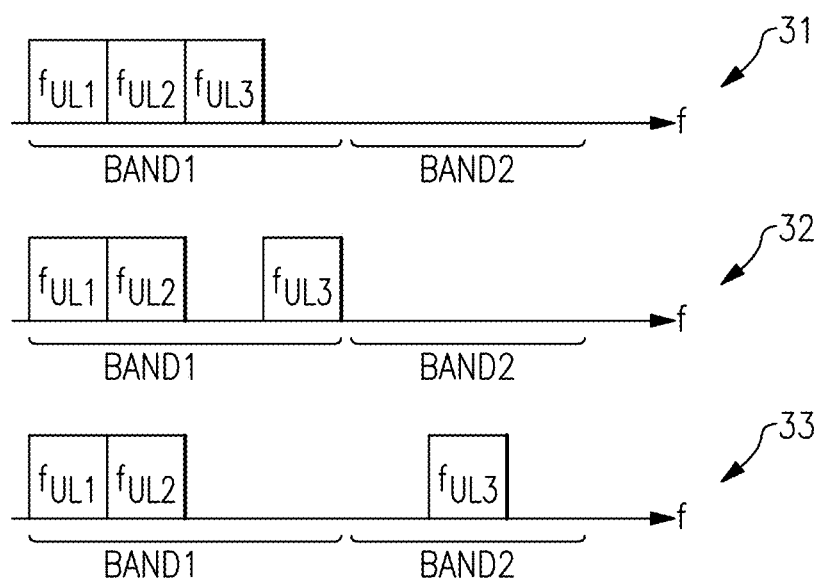
FIG. 2B illustrates various examples of uplink carrier aggregation for the communication link of FIG. 2A.

FIG. 2B illustrates various examples of uplink carrier aggregation for the communication link of FIG. 2A. FIG. 2B includes a first carrier aggregation scenario 31, a second carrier aggregation scenario 32, and a third carrier aggregation scenario 33, which schematically depict three types of carrier aggregation.

The carrier aggregation scenarios 31-33 illustrate different spectrum allocations for a first component carrier $f_{UL1}$, a second component carrier $f_{UL2}$, and a third component carrier $f_{UL3}$. Although FIG. 2B is illustrated in the context of aggregating three component carriers, carrier aggregation can be used to aggregate more or fewer carriers. Moreover, although illustrated in the context of uplink, the aggregation scenarios are also applicable to downlink.

The first carrier aggregation scenario 31 illustrates intra-band contiguous carrier aggregation, in which component carriers that are adjacent in frequency and in a common frequency band are aggregated. For example, the first carrier aggregation scenario 31 depicts aggregation of component carriers $f_{UL1}$, $f_{UL2}$, and $f_{UL3}$ that are contiguous and located within a first frequency band BAND1.

With continuing reference to FIG. 2B, the second carrier aggregation scenario 32 illustrates intra-band non-continuous carrier aggregation, in which two or more components carriers that are non-adjacent in frequency and within a common frequency band are aggregated. For example, the second carrier aggregation scenario 32 depicts aggregation of component carriers $f_{UL1}$, $f_{UL2}$, and $f_{UL3}$ that are non-contiguous, but located within a first frequency band BAND1.

The third carrier aggregation scenario 33 illustrates inter-band non-contiguous carrier aggregation, in which component carriers that are non-adjacent in frequency and in multiple frequency bands are aggregated. For example, the third carrier aggregation scenario 33 depicts aggregation of component carriers $f_{UL1}$ and $f_{UL2}$ of a first frequency band BAND1 with component carrier $f_{UL3}$ of a second frequency band BAND2.

Figure 2C:
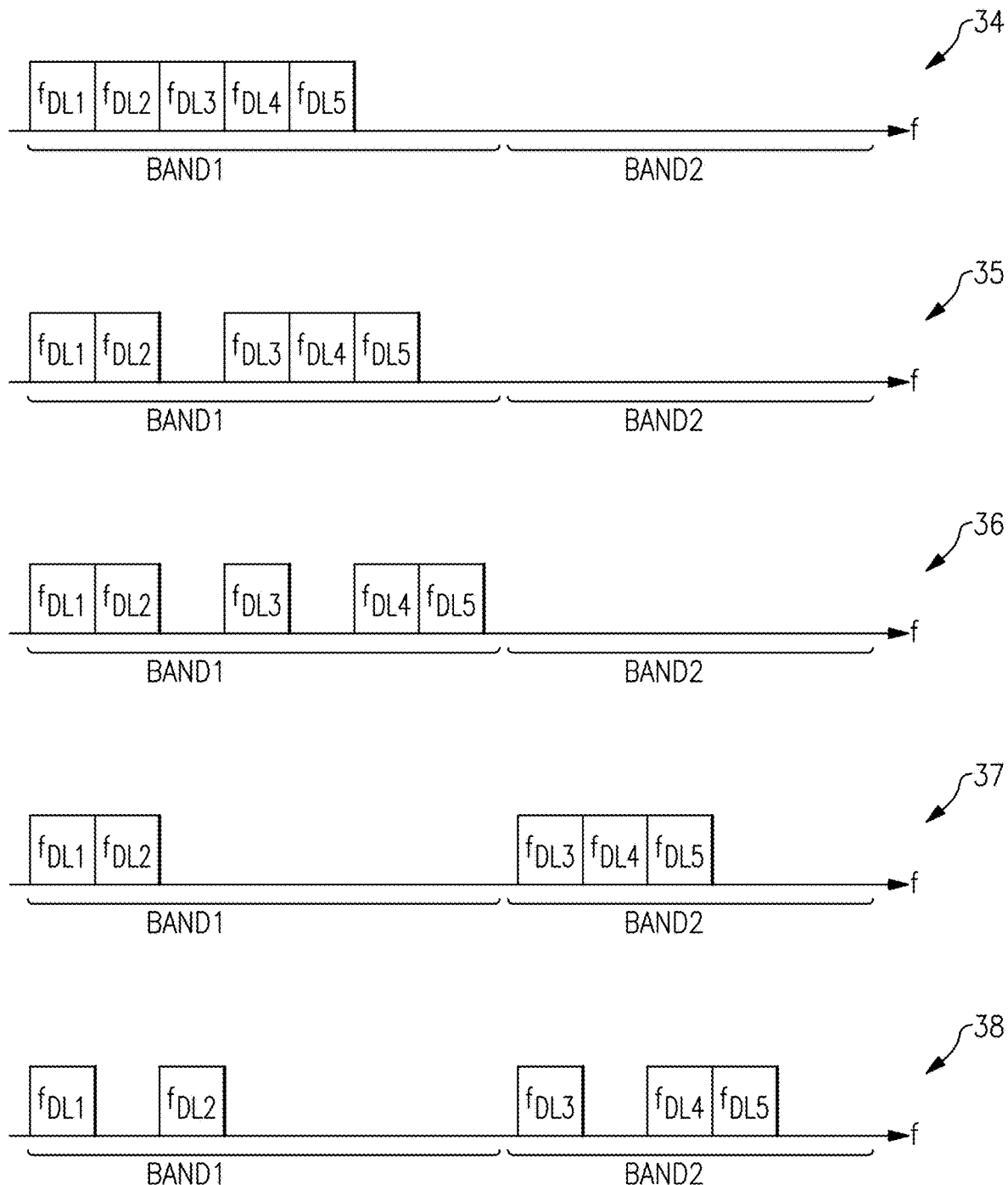
FIG. 2C illustrates various examples of downlink carrier aggregation for the communication link of FIG. 2A.

FIG. 2C illustrates various examples of downlink carrier aggregation for the communication link of FIG. 2A. The examples depict various carrier aggregation scenarios 34-38 for different spectrum allocations of a first component carrier $f_{DL1}$, a second component carrier $f_{DL2}$, a third component carrier $f_{DL3}$, a fourth component carrier $f_{DL4}$, and a fifth component carrier $f_{DL5}$. Although FIG. 2C is illustrated in the context of aggregating five component carriers, carrier aggregation can be used to aggregate more or fewer carriers. Moreover, although illustrated in the context of downlink, the aggregation scenarios are also applicable to uplink.

The first carrier aggregation scenario 34 depicts aggregation of component carriers that are contiguous and located within the same frequency band. Additionally, the second carrier aggregation scenario 35 and the third carrier aggregation scenario 36 illustrates two examples of aggregation that are non-contiguous, but located within the same frequency band. Furthermore, the fourth carrier aggregation scenario 37 and the fifth carrier aggregation scenario 38 illustrates two examples of aggregation in which component carriers that are non-adjacent in frequency and in multiple frequency bands are aggregated. As a number of aggregated component carriers increases, a complexity of possible carrier aggregation scenarios also increases.

With reference to FIGS. 2A-2C, the individual component carriers used in carrier aggregation can be of a variety of frequencies, including, for example, frequency carriers in the same band or in multiple bands. Additionally, carrier aggregation is applicable to implementations in which the individual component carriers are of about the same bandwidth as well as to implementations in which the individual component carriers have different bandwidths.

Certain communication networks allocate a particular user device with a primary component carrier (PCC) or anchor carrier for uplink and a PCC for downlink. Additionally, when the mobile device communicates using a single frequency carrier for uplink or downlink, the user device communicates using the PCC. To enhance bandwidth for uplink communications, the uplink PCC can be aggregated with one or more uplink secondary component carriers (SCCs). Additionally, to enhance bandwidth for downlink communications, the downlink PCC can be aggregated with one or more downlink SCCs.

In certain implementations, a communication network provides a network cell for each component carrier. Additionally, a primary cell can operate using a PCC, while a secondary cell can operate using a SCC. The primary and secondary cells may have different coverage areas, for instance, due to differences in frequencies of carriers and/or network environment.

License assisted access (LAA) refers to downlink carrier aggregation in which a licensed frequency carrier associated with a mobile operator is aggregated with a frequency carrier in unlicensed spectrum, such as WiFi. LAA employs a downlink PCC in the licensed spectrum that carries control and signaling information associated with the communication link, while unlicensed spectrum is aggregated for wider downlink bandwidth when available. LAA can operate with dynamic adjustment of secondary carriers to avoid WiFi users and/or to coexist with WiFi users. Enhanced license assisted access (eLAA) refers to an evolution of LAA that aggregates licensed and unlicensed spectrum for both downlink and uplink.

Examples of Adaptive Power Amplifier Biasing 5G provides enhanced flexibility in signaling, including a variable number of resource blocks (RBs) for control over signal bandwidth allocation. For example, certain 5G signals have a carrier bandwidth that can be adjusted up to about 100 MHz in frequency range 1 (FR1), with further flexibility in widening signal bandwidth by carrier aggregation. The variation in signal bandwidth provides a number of challenges to power amplification.

For example, one performance specification of a power amplifier is adjacent channel power ratio (ACPR), which is based on power amplifier linearity. Poor ACPR can lead to a number of issues, such as degradation in signal reception on adjacent channels. The bandwidth of a biasing circuit directly effects the amount of ACPR created in the power amplifier, which in turn effects adjacent channel performance. For example, increasing the bandwidth of the biasing circuit allows more noise/spurs to reach the input of the power amplifier, since wider bandwidth provides less noise rejection. Thus, a trade-off is present between noise/spur rejection and linearity effects.

There is a need for a power amplifier system suitable for handling wide bandwidth RF signals, while still maintaining performance for narrow bandwidth signals.

Apparatus and methods for adaptive power amplifier biasing are provided herein. In certain embodiments, a power amplifier system includes a power amplifier that provides amplification to an RF signal, and a power amplifier bias control circuit that generates a bias signal of the power amplifier based on a bandwidth signal indicating a bandwidth of the RF signal. The power amplifier bias control circuit has a bandwidth that adapts to the bandwidth of the RF signal as indicated by the bandwidth signal.

Thus, a narrow bias circuit bandwidth can be used for narrow signal bandwidth while a wide bias circuit bandwidth can be used for wide signal bandwidth. Accordingly, the bandwidth of the power amplifier bias control circuit can widen in response to the bandwidth signal indicating an increase in the bandwidth of the RF signal, and narrow in response to the bandwidth signal indicating a decrease in the bandwidth of the RF signal.

In certain implementations, the power amplifier bias control circuit includes a bias circuit that generates a bias input signal, and a controllable filter that is controlled by the bandwidth signal and generates the bias signal of the power amplifier based on filtering the bias input signal. Accordingly, in certain implementations, the bandwidth signal is used to control a filtering characteristic of a filter of the power amplifier bias control circuit.

The bandwidth signal can be provided to the power amplifier bias control circuit in a wide variety of ways, including from a baseband processor or by a self-detection circuit that automatically adapts the biasing bandwidth based on detecting the allocated bandwidth of the RF signal.

In one example, the power amplifier bias control circuit is configured to receive the bandwidth signal as a digital data over a serial interface, such as a Mobile Industry Processor Interface Radio Frequency Front End (MIPI RFFE) bus. In another example, the power amplifier system further includes a detector that generates the bandwidth signal based on detecting the bandwidth of the RF signal.

Figure 3:
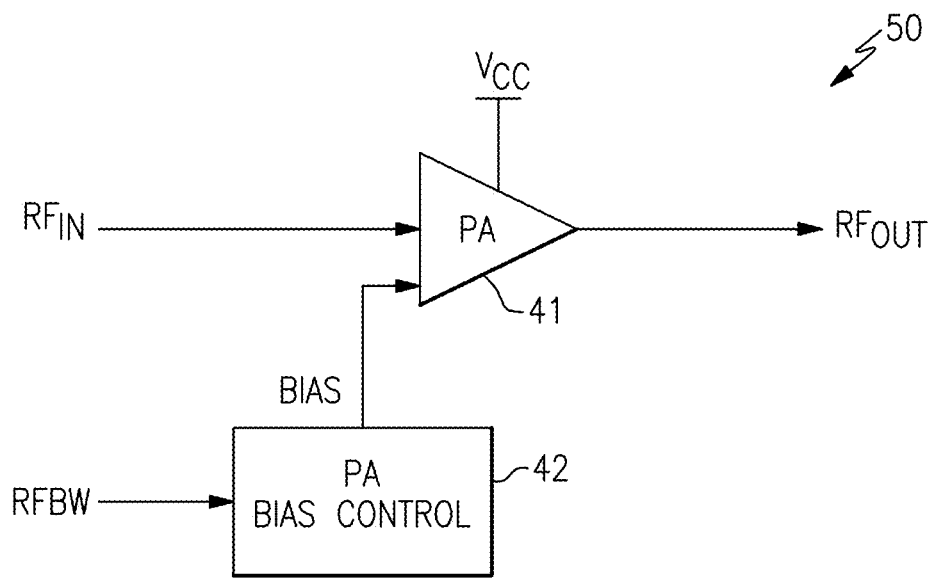
FIG. 3 is a schematic diagram of a power amplifier system according to one embodiment.

FIG. 3 is a schematic diagram of a power amplifier system 50 according to one embodiment. The power amplifier system 50 includes a power amplifier 41 and a power amplifier bias control circuit 42.

In the illustrated embodiment, the power amplifier 41 is powered by a power amplifier supply voltage $V_{CC}$. Additionally, the power amplifier 41 amplifiers an RF input signal $RF_{IN}$ to generate an RF output signal $RF_{OUT}$.

As shown in FIG. 3, the power amplifier bias circuit 42 receives a bandwidth signal RFBW indicating a bandwidth of the RF input signal $RF_{IN}$. Additionally, the power amplifier bias circuit 42 generates a bias signal BIAS of the power amplifier 41 based on the bandwidth signal RFBW.

In certain implementations, the power amplifier bias control circuit 42 has a bandwidth that adapts to the bandwidth of the RF input signal $RF_{IN}$ as indicated by the bandwidth signal RFBW. Accordingly, the bandwidth of the power amplifier bias control circuit 42 widens in response to the bandwidth signal RFBW indicating an increase in the bandwidth of the RF input signal $RF_{IN}$, and narrows in response to the bandwidth signal RFBW indicating a decrease in the bandwidth of the RF input signal $RF_{IN}$. Thus, a narrow bias circuit bandwidth is used for narrow signal bandwidth while a wide bias circuit bandwidth is used for wide signal bandwidth.

Figure 4A:
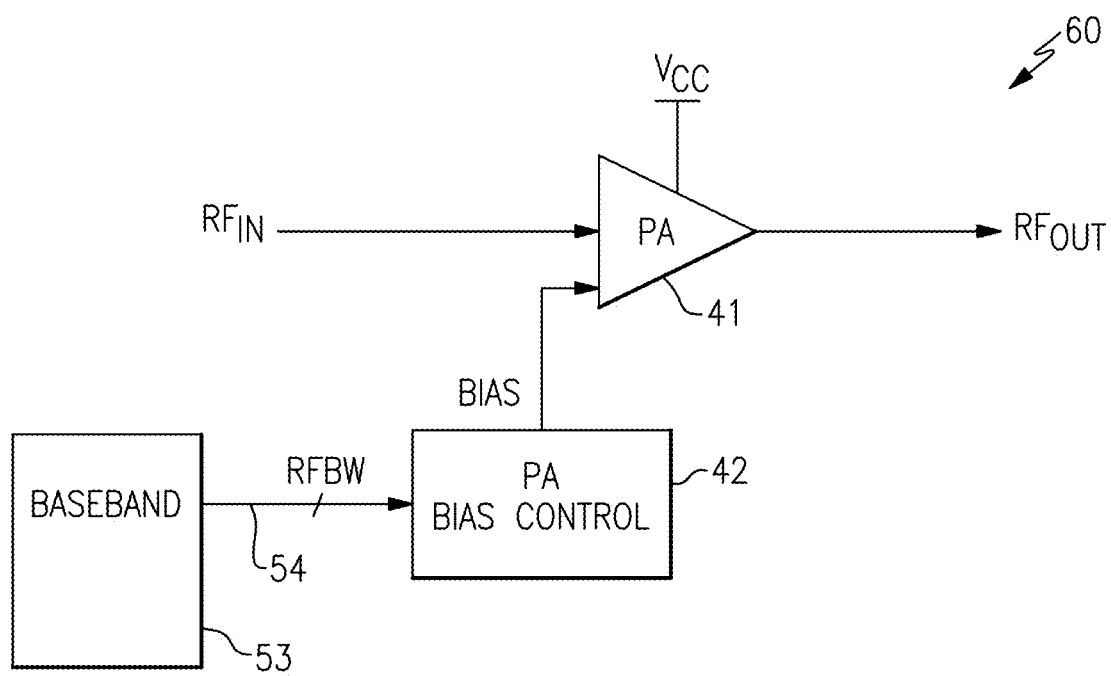
FIG. 4A is a schematic diagram of a power amplifier system according to another embodiment.

FIG. 4A is a schematic diagram of a power amplifier system 60 according to another embodiment. The power amplifier system 60 of FIG. 4A is similar to the power amplifier system 50 of FIG. 3, except that the power amplifier system 60 is coupled to a baseband processor 53 over a serial interface 54.

As shown in FIG. 4A, the baseband processor 53 provides the power amplifier bias control circuit 42 with the bandwidth signal RFBW over the serial interface 54. Thus, the bandwidth signal RFBW is provided by sending digital data over an interface or bus, in this embodiment.

Figure 4B:
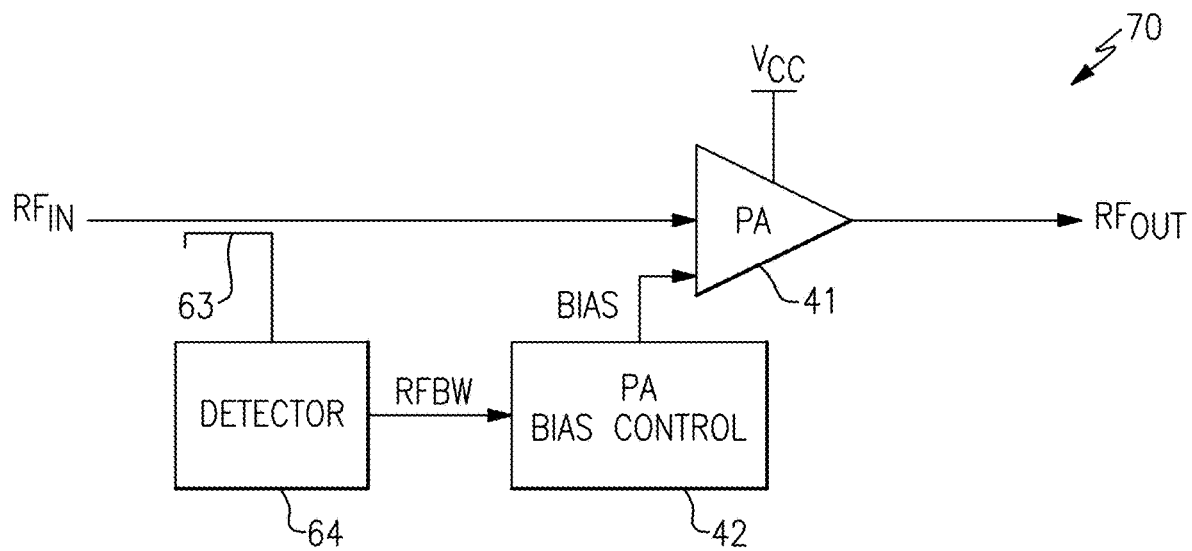
FIG. 4B is a schematic diagram of a power amplifier system according to another embodiment.

FIG. 4B is a schematic diagram of a power amplifier system 70 according to another embodiment. The power amplifier system 70 of FIG. 4B is similar to the power amplifier system 50 of FIG. 3, except that the power amplifier system 70 further includes a directional coupler 63 and a detector 64.

In the illustrated embodiment, the directional coupler 64 generates a coupled signal based on sensing the RF input signal RFm. Additionally, the detector 64 processes the coupled signed to generate the bandwidth signal RFBW. Accordingly, the bandwidth signal RFBW is generated by detecting the bandwidth of the RF input signal $RF_{IN}$, in this embodiment.

Figure 5:
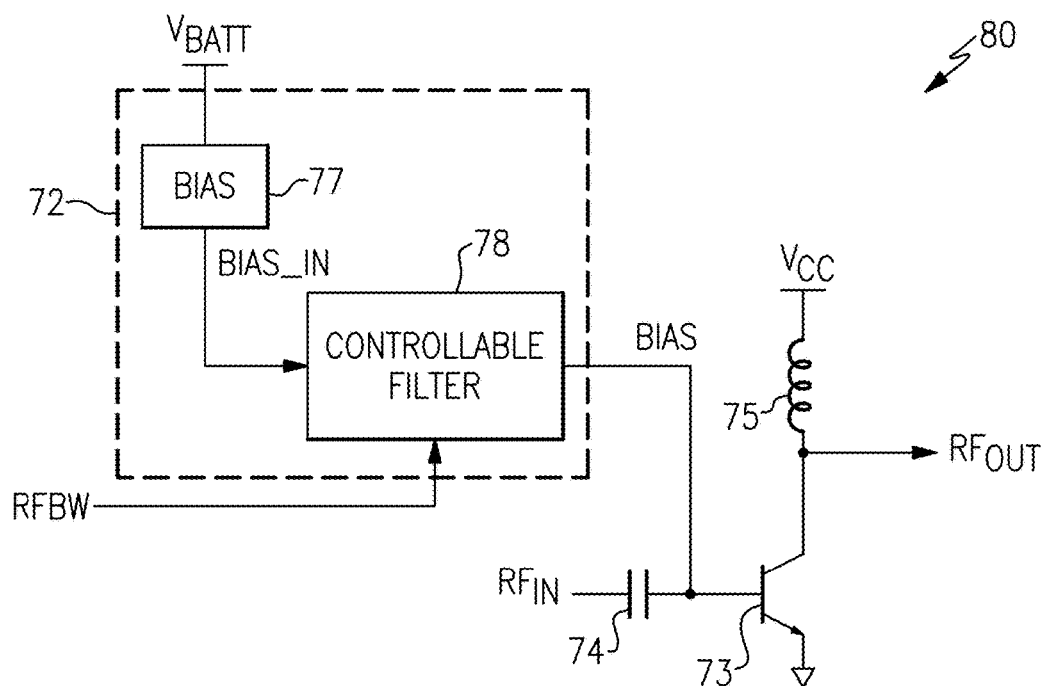
FIG. 5 is a schematic diagram of a power amplifier system according to another embodiment.

FIG. 5 is a schematic diagram of a power amplifier system 80 according to another embodiment. The power amplifier system 80 includes a power amplifier bias control circuit 72 and a power amplifier that includes a power amplifier transistor 73, an input DC blocking capacitor 74, and an output choke inductor 75.

In the illustrated embodiment, the base of the power amplifier transistor 73 receives the RF input signal $RF_{IN}$ by way of the input DC blocking capacitor 74. Additionally, the base of the power amplifier transistor 73 receives the bias signal BIAS from the power amplifier bias control circuit 72. Furthermore, the emitter of the power amplifier transistor 73 is electrically connected to ground, and the collector of the power amplifier transistor 73 generates the RF output signal $RF_{OUT}$. The collector of the power amplifier transistor 73 also receives a power amplifier supply voltage $V_{CC}$ by way of the output choke inductor 75.

Although FIG. 5 illustrates one implementation of a power amplifier, skilled artisans will appreciate that the teachings described herein can be applied to a variety of power amplifier structures, such as multi-stage power amplifiers and power amplifiers employing other transistor structures. For example, in some implementations a bipolar power amplifier transistor can be omitted in favor of employing a field-effect transistor (FET), such as a silicon FET, a gallium arsenide (GaAs) high electron mobility transistor (HEMT), or a laterally diffused metal oxide semiconductor (LDMOS) transistor.

In the illustrated embodiment, the power amplifier bias control circuit 72 includes a bias circuit 77 and a controllable filter 78. As shown in FIG. 5, the bias circuit 77 is powered by a battery voltage $V_{BATT}$ from a battery, and generates a bias input signal BIAS_IN for the controllable filter 78. Additionally, the controllable filter 78 is controlled by the bandwidth signal RFBW and generates the bias signal BIAS for the power amplifier transistor 73 based on filtering the bias input signal BIAS_IN. Thus, the bandwidth signal RFBW controls a filtering characteristic of the controllable filter 78.

Figure 6:
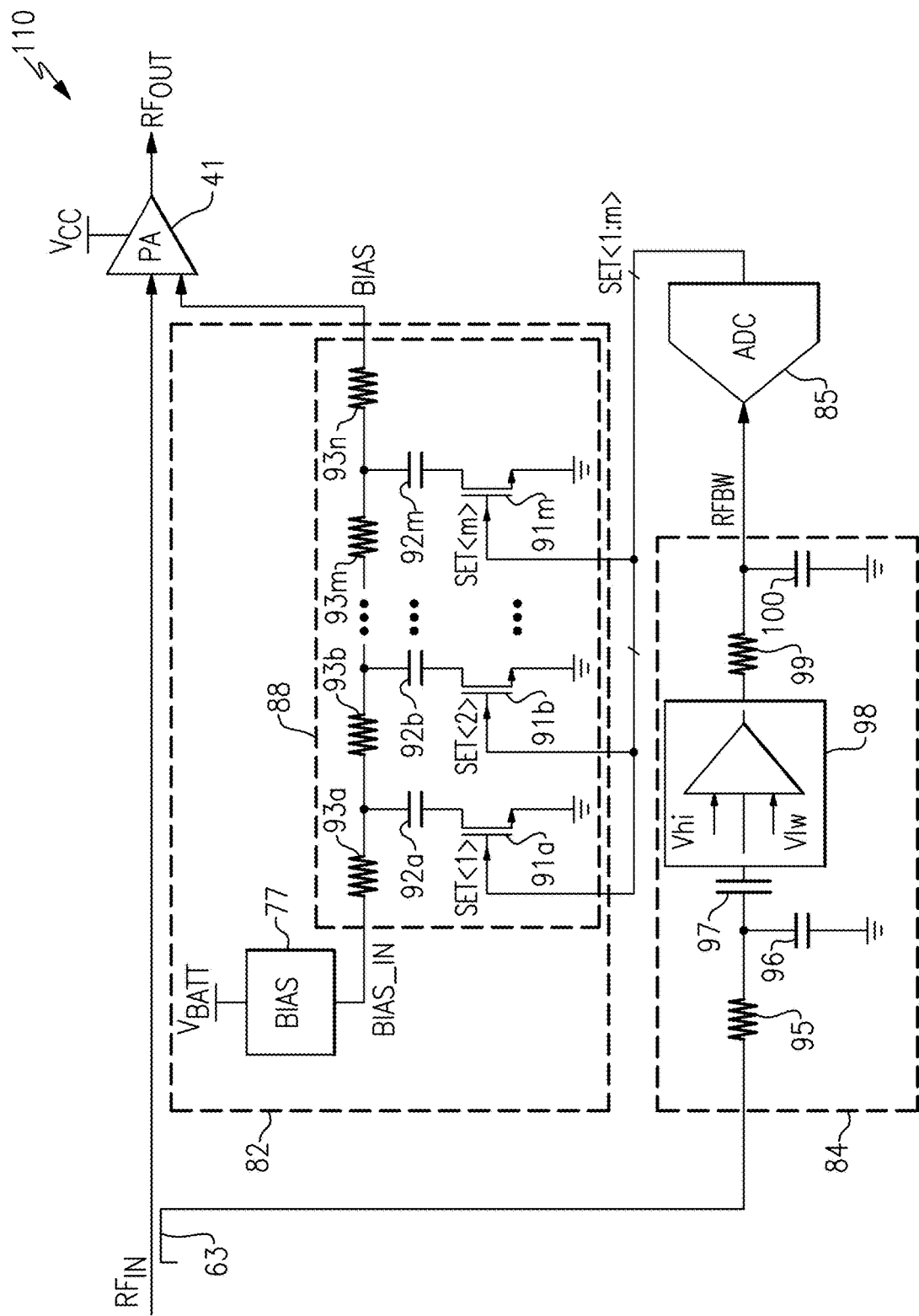
FIG. 6 is a schematic diagram of a power amplifier system according to another embodiment.

FIG. 6 is a schematic diagram of a power amplifier system 110 according to another embodiment. The power amplifier system 110 includes a power amplifier 41, a directional coupler 63, a power amplifier bias control circuit 82, a detector 84, and an analog-to-digital converter (ADC) 85.

Although one embodiment of a power amplifier system is depicted in FIG. 6, the teachings herein are applicable to power amplifier systems implemented in a wide variety of ways.

As shown in FIG. 6, the power amplifier 41 amplifies an RF input signal $RF_{IN}$ to generate an RF output signal $RF_{OUT}$. Additionally, the power amplifier 41 is powered by a power amplifier supply voltage $V_{CC}$, and receives a bias signal BIAS from the power amplifier bias control circuit 82.

With continuing reference to FIG. 6, the directional coupler 63 senses the RF input signal $RF_{IN}$ to generate a coupled signal that is provided to the detector 84. The detector 84 processes the coupled signal to generate a bandwidth signal RFBW indicating the bandwidth of the RF input signal $RF_{IN}$. The bandwidth signal RFBW is analog in this embodiment, and is converted to a multi-bit digital control signal SET<1:m> by the ADC 85. Additionally, the multi-bit digital control signal SET<1:m> has m bits that are used to control the bandwidth of the power amplifier bias control circuit 82, where m is an integer greater than 2, for instance, four or more.

In the illustrated embodiment, the power amplifier bias control circuit 82 includes a bias circuit 77 and a controllable filter 88. The bias circuit 77 receives a battery voltage $V_{BATT}$ and generates a bias input signal BIAS_IN. Additionally, the controllable filter 88 includes bandwidth control transistors 91a, 91b, ... 91m, shunt capacitors 92a, 92b, ... 92m, and series resistors 93a, 93b, ... 93m, 93n.

As shown in the embodiment of FIG. 6, the series resistors 93a, 93b, ... 93m, 93n are electrically connected in series between the bias input signal BIAS_IN and the bias signal BIAS, while the shunt capacitors 92a, 92b, ... 92m are in shunt to the bias path through the series resistors 93a, 93b, ... 93m, 93n. Additionally, the shunt capacitors 92a, 92b, ... 92m are selectively connected to ground or disconnected from ground using the bandwidth control transistors 91a, 91b, . . . 91m, respectively. As shown in FIG. 6, the bandwidth control transistors 91a, 91b, . . . 91m are controlled by individual bits of the multi-bit digital control signal SET<1:m>, in this embodiment.

Thus, the multi-bit digital control signal SET<1:m> is used to select an active number of the shunt capacitors 92a, 92b, . . . 92m, in this embodiment.

With continuing reference to FIG. 6, the detector 84 includes an input series resistor 95, an input shunt capacitor 96, an input series capacitor 97, a zero crossing comparator 98, an output series resistor 99, and an output shunt capacitor 100, in this embodiment. The zero crossing comparator 98 serves to compare zero crossing of a high pass filtered detection signal Vhi to a low pass filtered detection signal Vlw to thereby extract the bandwidth of the RF input signal $RF_{IN}$. Circuitry for processing the RF input signal $RF_{IN}$ to generate the high pass filtered detection signal Vhi and the low pass filtered detection signal Vlw is not show in FIG. 6.

Figure 7A:
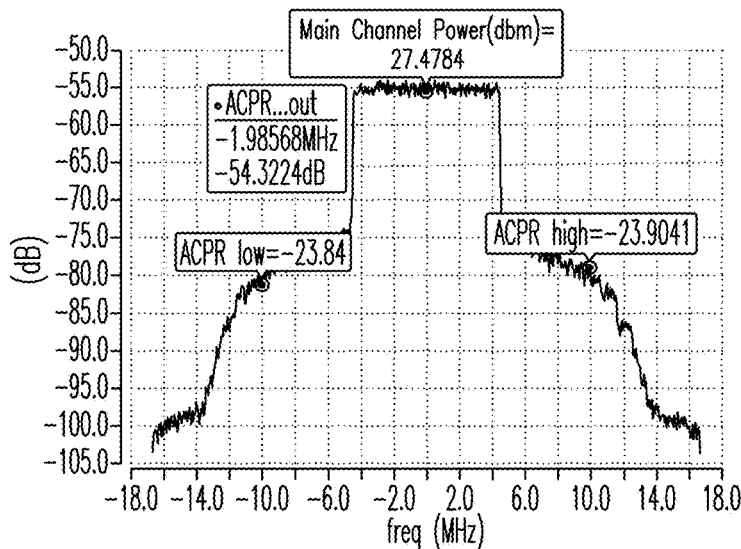
FIG. 7A is a graph of one example of adjacent channel power ratio (ACPR) for a 10 megahertz (MHz) radio frequency (RF) signal bandwidth and a bias circuit bandwidth of 5 MHz.
Figure 7B:
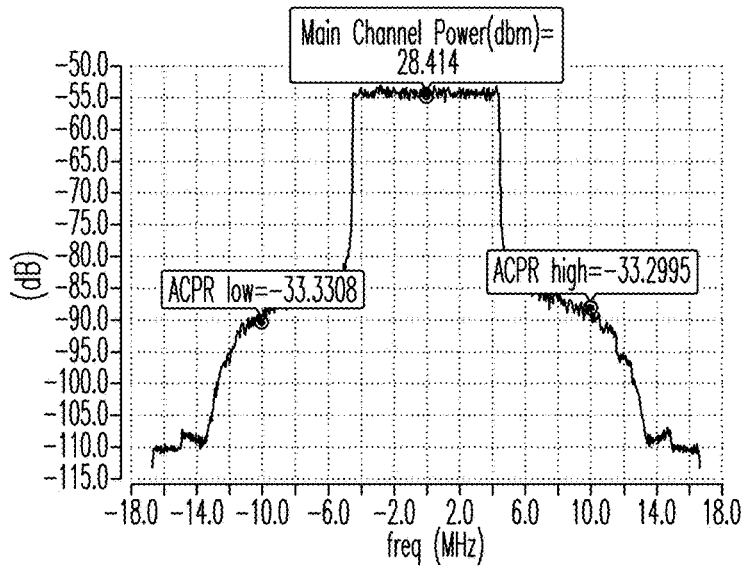
FIG. 7B is a graph of one example of ACPR for a 10 MHz RF signal bandwidth and a bias circuit bandwidth of 15 MHz.
Figure 7C:
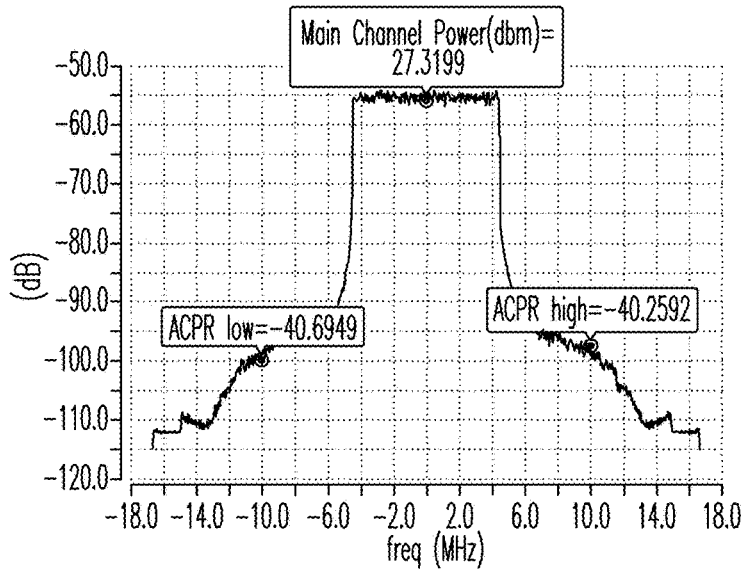
FIG. 7C is a graph of one example of ACPR for a 10 MHz RF signal bandwidth and a bias circuit bandwidth of 25 MHz.

FIG. 7A is a graph of one example of ACPR for a 10 MHz RF signal bandwidth and a bias circuit bandwidth of 5 MHz. FIG. 7B is a graph of one example of ACPR for a 10 MHz RF signal bandwidth and a bias circuit bandwidth of 15 MHz. FIG. 7C is a graph of one example of ACPR for a 10 MHz RF signal bandwidth and a bias circuit bandwidth of 25 MHz.

As shown in FIGS. 7A-7C, increasing bias circuit bandwidth for a given signal bandwidth improves ACPR.

Figure 8:
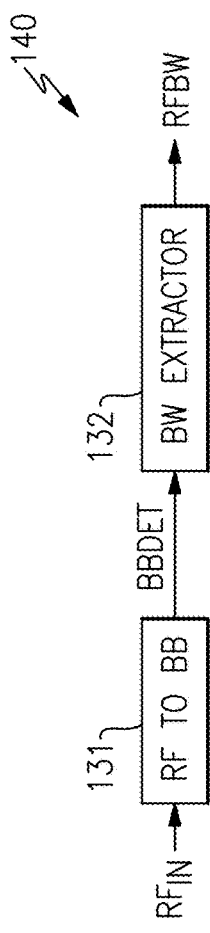
FIG. 8 is a schematic diagram of a detector according to one embodiment.

FIG. 8 is a schematic diagram of a detector 140 according to one embodiment. In the illustrated embodiment, the detector 140 includes an RF to baseband detection circuit 131 and a bandwidth extractor 132.

As shown in FIG. 8, the RF to baseband detection circuit 141 generates a baseband detection signal BBDET based on the RF input signal $RF_{IN}$. In certain implementations, the RF to baseband detection circuit 141 is implemented as a root mean square (RMS) detector. However, other implementations are possible.

The bandwidth extractor 132 processes the baseband detection signal BBDET to generate a bandwidth signal RFBW indicating a bandwidth of the RF input signal $RF_{IN}$. In certain implementations, the bandwidth is detected based on processing the baseband detection signal BBDET to generate a high pass detection signal and a low pass detection signal, and comparing zero crossings of the high pass detection signal to zero crossings of the low pass detection signal.

In certain implementations, the bandwidth signal RFBW is analog, and an ADC is included for generating a digital representation of the bandwidth signal RFBW.

Figure 9:
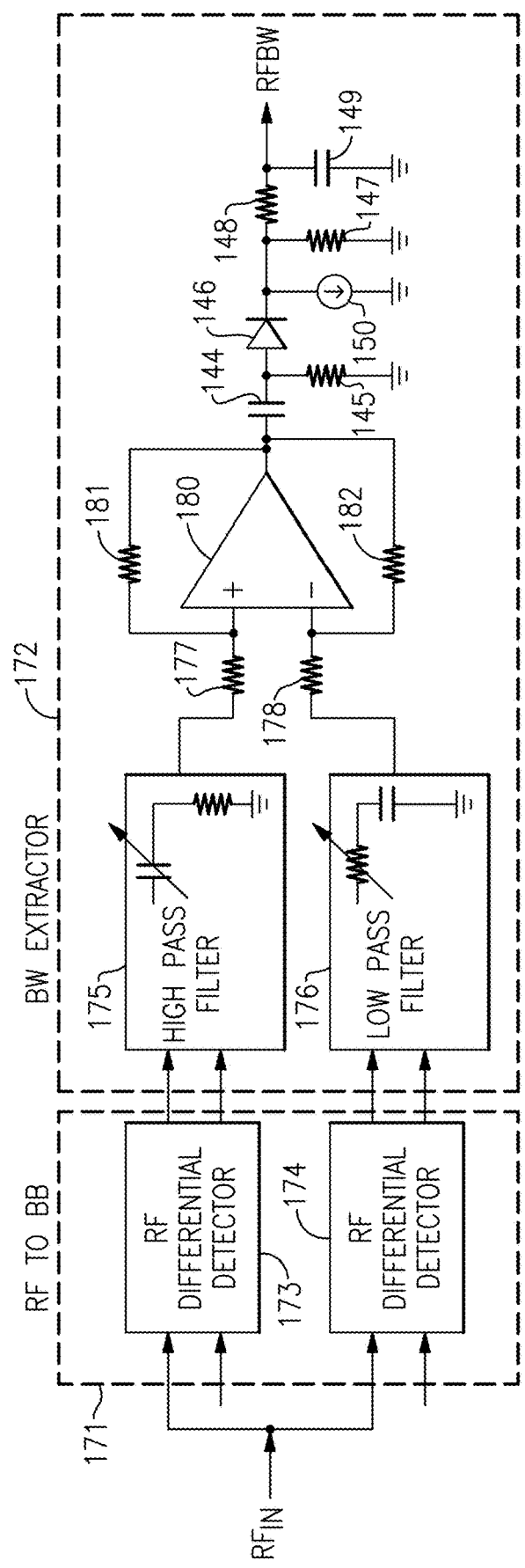
FIG. 9 is a schematic diagram of a detector according to another embodiment.

FIG. 9 is a schematic diagram of a detector 190 according to another embodiment. The detector 190 includes an RF to baseband detection circuit 171 and a bandwidth extractor 172. The baseband detection circuit 171 includes a first RF differential detector 173 and a second RF differential detector 174. Additionally, the bandwidth extractor 172 includes a high pass filter 175, a low pass filter 176, a first input resistor 177, a second input resistor 178, a comparator 180, a first feedback resistor 181, a second feedback resistor 182, an output series capacitor 144, a first output shunt resistor 145, a diode 146, a second output shunt resistor 147, an output series resistor 148, an output shunt capacitor 149, and an output shunt current source 150 (which in certain implementations represents a leakage current).

In the illustrated embodiment, the first RF differential detector 173 and the second RF differential detector 174 process the RF input signal $RF_{IN}$ to generate a first differential baseband detection signal and a second differential baseband detection signal, respectively. Additionally, the high pass filter 175 high pass filters the first differential baseband detection signal to generate a high pass filtered signal for a first input of the comparator 180, while the low pass filter 176 low pass filters the second differential baseband detection signal to generate a low pass filtered signal for a second input of the comparator 180. In certain implementations, the high pass filter 175 and/or the low pass filter 176 are controllable.

The output of the comparator 180 serves to generate pulses representing a comparison of zero crossings of the high pass filtered signal to zero crossings of the low pass filtered signal. In this example, the comparator 180 is implemented as an operational amplifier. However, other implementations are possible.

The output pulses from the comparator 180 are processed by the output circuitry of the bandwidth extractor 190 to generate the bandwidth signal RFBW indicating a bandwidth of the RF input signal $RF_N$. In certain implementations, the bandwidth signal RFBW is further processed by a detection signal linearization circuit (see for example, the detection signal linearization circuitry of FIGS. 11 and 12) and/or converted to a digital signal using an ADC.

Figure 10:
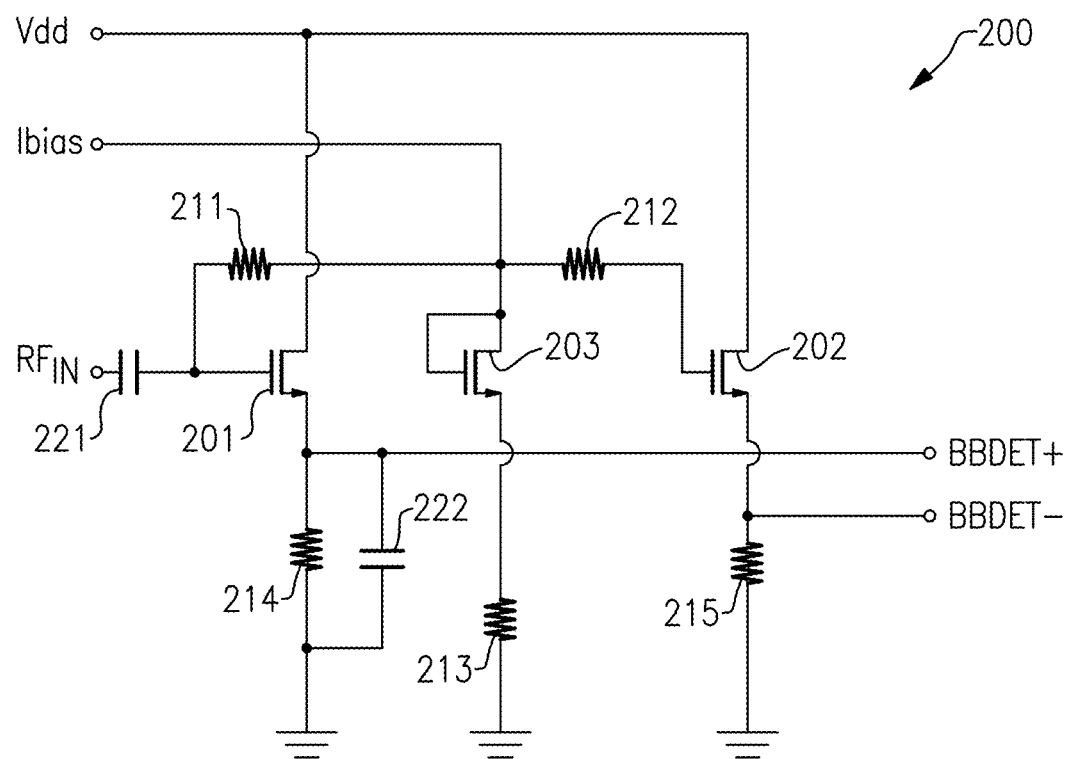
FIG. 10 is a schematic diagram of an RF to baseband detection circuit according to one embodiment.

FIG. 10 is a schematic diagram of an RF to baseband detection circuit 200 according to one embodiment.

The RF to baseband detection circuit 200 of FIG. 10 illustrates one embodiment of a detector for detecting the bandwidth of an RF signal. The RF to baseband detector 200 is implemented as a root mean square (RMS) detector, in this example. However, the teachings herein are applicable detectors implemented in a wide variety of ways. Accordingly, other implementations are possible.

With continuing reference to FIG. 10, the RF to baseband detection circuit 200 receives an RF input signal $RF_{IN}$, and processes the RF input signal $RF_{IN}$ to generate a differential detection signal corresponding to a difference between a non-inverted detection signal BBDET+ and an inverted detection signal BBDET−.

The RF to baseband detection circuit 200 includes a first detection n-type field effect transistor (NFET) 201, a second detection NFET 202, a bias NFET 203, a first biasing resistor 211, a second biasing resistor 212, a third biasing resistor 213, a first detection resistor 214, a second detection resistor 215, an input capacitor 221, and a filter capacitor 222.

The input capacitor 221 couples the RF input signal $RF_N$ to a gate of the first detection NFET 201 while providing DC voltage blocking. The first biasing resistor 211 and the second biasing resistor 212 control the DC bias voltages of the first detection NFET 201 and the second detection NFET 202, respectively. The DC bias voltage level is based on a magnitude of a bias current provided through the bias NFET 203 and the third bias resistor 213.

The current through the first detection NFET 203 and the first detection resistor 214 changes in relation to the RF input signal $RF_{IN}$. Additionally, the filter capacitor 222 operates to filter the voltage across the first detection resistor 214. Thus, the non-inverted detection signal BBDET+ changes with the RF input signal $RF_{IN}$. The non-inverted detection signal BBDET+ also includes a DC component that is based on DC biasing, including for example, a magnitude of the bias current Ibias. To compensate for DC biasing, the second detection NFET 202 the second detection resistor 215 are used to generate the inverted detection signal BBDET−, which has a DC component that tracks the DC component of the non-inverted detection signal.

By using differential signaling, a detection signal that changes with an RMS value of the RF input signal $RF_{IN}$ is provided, while compensating or correction for a DC bias offset or error.

In the illustrated embodiment, the RF to baseband detection circuit 200 includes the first detection resistor 214 and the filter capacitor 222, which serve to control the bandwidth of RMS detection. In certain implementations, at least one of the first detection resistor 214 or the filter capacitor 222 is controllable to provide flexibility in selecting an RMS detector bandwidth desired for a particular application and/or to compensate for process, voltage, and/or temperature (PVT) variation.

Figure 11:
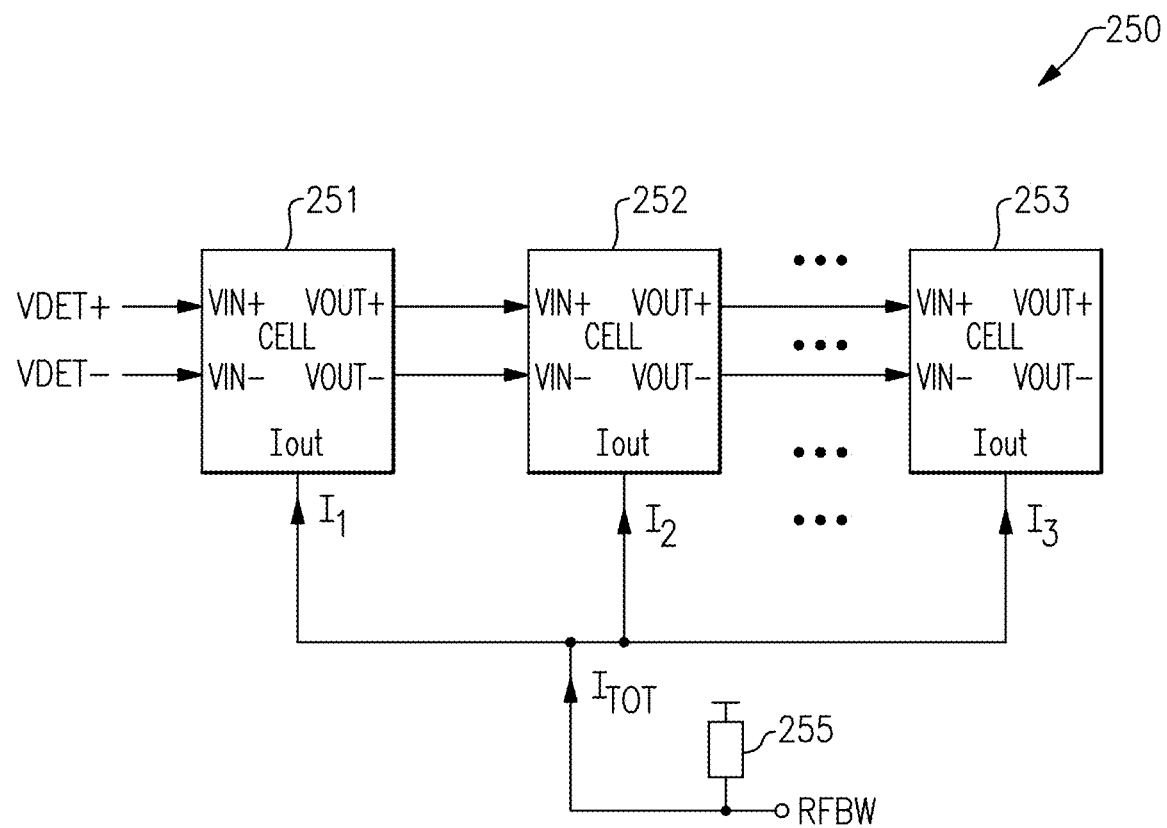
FIG. 11 is a schematic diagram of a detection signal linearization circuit according to one embodiment.

FIG. 11 is a schematic diagram of a detection signal linearization circuit 250 according to one embodiment.

The detection signal linearization circuit 250 of FIG. 11 illustrates one embodiment of linearization circuitry for enhancing the performance of a detector. However, the teachings herein are applicable to detectors implemented in a wide variety of ways. Accordingly, other implementations are possible.

The detection signal linearization circuit 250 is used to generate a bandwidth signal RFBW, which changes in relation to a signal bandwidth indicated by an input differential detection signal corresponding to a difference between a non-inverted detection signal VDET+ and an inverted detection signal VDET−.

For example, the input differential detection signal to the detection signal linearization circuit 250 can correspond to an output of a bandwidth extractor (for instance, the bandwidth extractor 132 of FIG. 8 or the bandwidth extractor 172 of FIG. 9), and the detection signal linearization circuit 250 can serve to linearize the detection signal to aid in processing by downstream circuitry (for instance, an ADC and/or a power amplifier bias control circuit).

The detection signal linearization circuit 250 includes a first converter cell 251, a second converter cell 252, and a third converter cell 253 arranged in a cascade. As indicated by the ellipses, a desired number of converter cells can be included to achieve desired operating characteristics. In certain implementations, the detection signal linearization circuit 250 includes three or more cascaded converter cells.

As shown in FIG. 11, the first converter cell 251 generates a first current $I_1$ based on the input differential detection signal VDET+, VDET−. Additionally, the first converter cell 251 provides a first down-shifted detection signal to the second converter cell 252 based on down-shifting the voltage of the input detection signal VDET+, VDET−. The second converter cell 252 generates a second current $I_2$ based on the first down-shifted differential detection signal. The second converter cell 252 further provides a second down-shifted detection signal to the third converter cell 253 based on down-shifting the voltage of the first output detection signal. Furthermore, the third converter cell 253 generates a third current $I_3$ based on the second down-shifted detection signal. As shown in FIG. 11, in the illustrated embodiment, the converter cells each include non-inverted input voltage VIN+, inverted input voltage VIN−, non-inverted output voltage VOUT+, inverted output voltage VOUT−, and output current Iout terminals.

As shown in FIG. 11, the currents from the converter cells 251-253 are summed to generate a total current $I_{TOT}$, which flows through the impedance 255 to generate the bandwidth signal RFBW. In certain implementations, the impedance 255 is connected to a positive reference voltage, such as a power high supply voltage.

Figure 12:
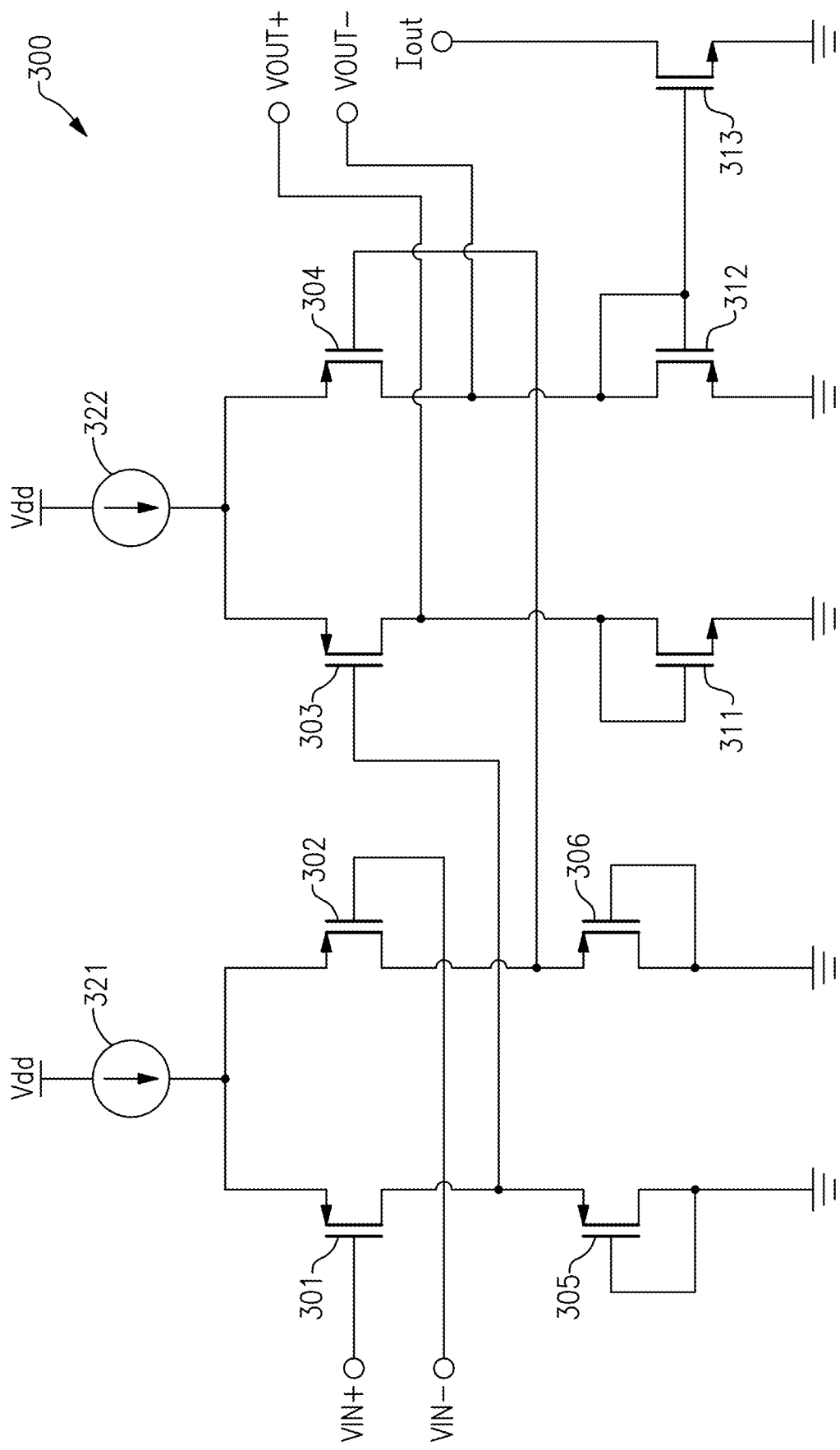
FIG. 12 is a schematic diagram of one embodiment of a converter cell for the detection signal linearization circuit of FIG. 11.

FIG. 12 is a schematic diagram of one embodiment of a converter cell 300 for the detection signal linearization circuit 250 of FIG. 11.

The converter cell 300 includes a first differential transistor pair including a first p-type field effect transistor (PFET) 301 and a second PFET 302, and a second differential transistor pair including a third PFET 303 and a fourth PFET 304. The converter cell 300 further includes a first load transistor pair including a fifth PFET 305 and a sixth PFET 306, and a second load transistor pair including a first NFET 311 and a second NFET 312. As shown in FIG. 12, the first load transistor pair serves as a load to the first differential transistor pair, and the second load transistor pair serves as a load to the second differential transistor pair.

The first differential transistor pair 301-302 amplifies a voltage difference between the differential input signal IN+, IN−. Additionally, the amplified voltage difference provided by the first differential transistor pair 301-302 is further amplified by the second differential transistor pair 303-304 to generate a differential output signal VOUT+, VOUT−.

The current through the second NFET 312 is mirrored using the mirror NFET 313 to generate an output current Iout for the converter cell 300.

Figure 13A:
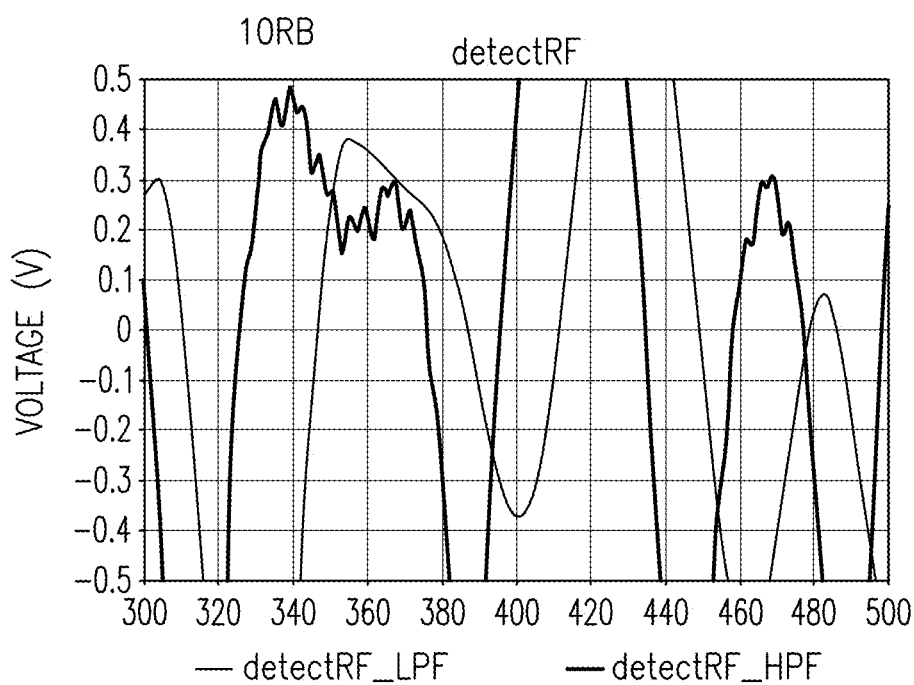
FIG. 13A is a graph of transient simulation results for one example of a detector detecting an RF signal with 10 resource blocks (RBs).

FIG. 13A is a graph of transient simulation results for one example of a detector detecting an RF signal with 10 RBs.

Figure 13B:
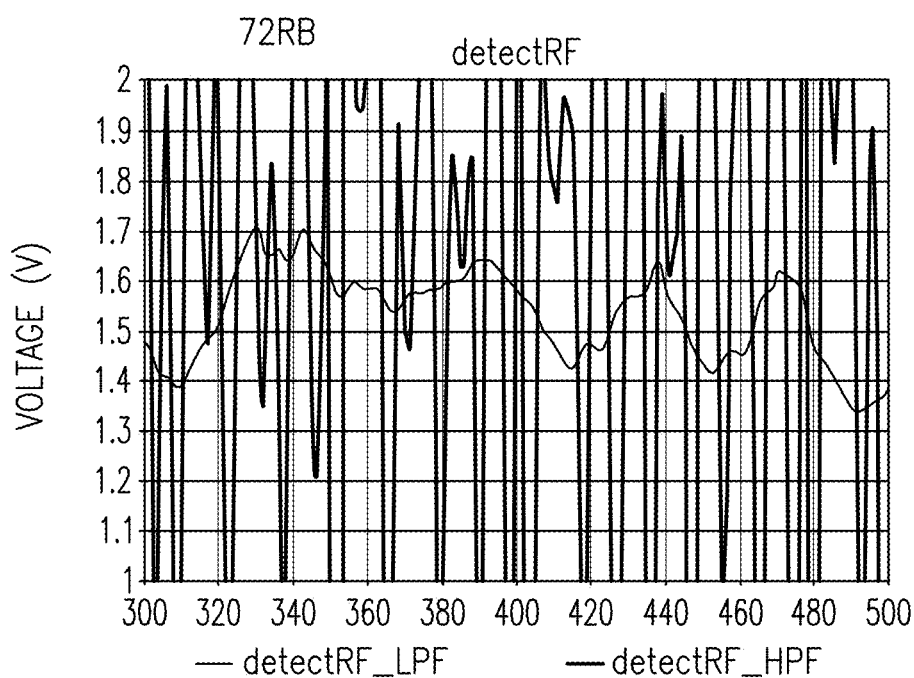
FIG. 13B is a graph of transient simulation results for one example of a detector detecting an RF signal with 72RBs.

FIG. 13B is a graph of transient simulation results for one example of a detector detecting an RF signal with 72 RBs.

With reference to FIGS. 13A and 13B, transient simulation results showing plots of detection signal voltage versus time are provided for one implementation of the detector 190 of FIG. 9. Plots are included for a high pass filtered detection signal (detectRF_HPF) outputted from the high pass filter 175 and for a low pass filtered detection signal (detectRF_LPF) outputted from the low pass filter 176.

As shown by the example results of FIGS. 13A and 13B, the number of zero crossings of the high pass filtered detection signal increases as the number of allocated RBs is increased. By comparing a number of zero crossings of the high pass filtered detection signal to a number of zero crossings of the low pass filtered detection signal, the number of RBs and thus the signal bandwidth can be detected.

Figure 14A:
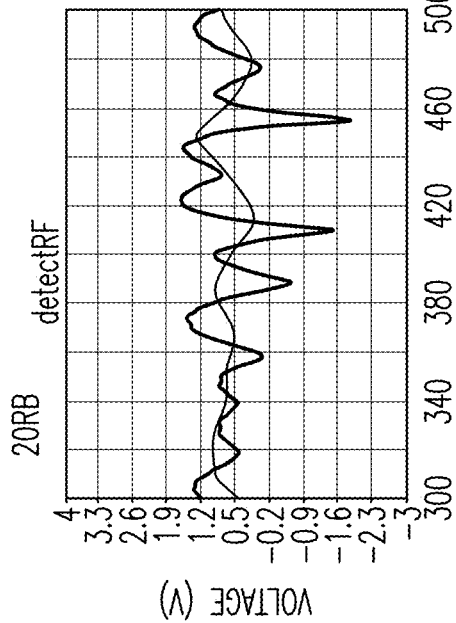
FIG. 14A is a graph of transient simulation results for one example of a detector detecting an RF signal with 10 RBs.

FIG. 14A is a graph of transient simulation results for one example of a detector detecting an RF signal with 10 RBs.

Figure 14B:
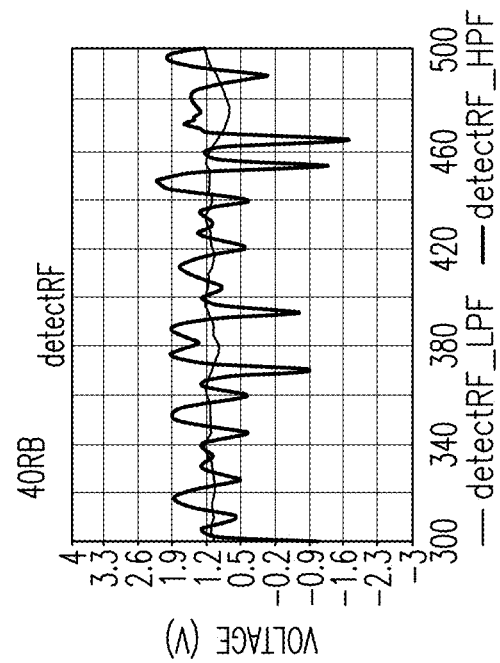
FIG. 14B is a graph of transient simulation results for one example of a detector detecting an RF signal with 20 RBs.

FIG. 14B is a graph of transient simulation results for one example of a detector detecting an RF signal with 20 RBs.

Figure 14C:
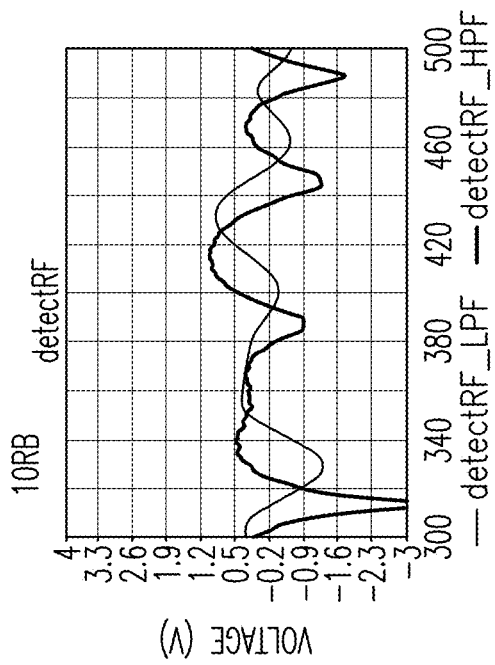
FIG. 14C is a graph of transient simulation results for one example of a detector detecting an RF signal with 30 RBs.

FIG. 14C is a graph of transient simulation results for one example of a detector detecting an RF signal with 30 RBs.

Figure 14D:
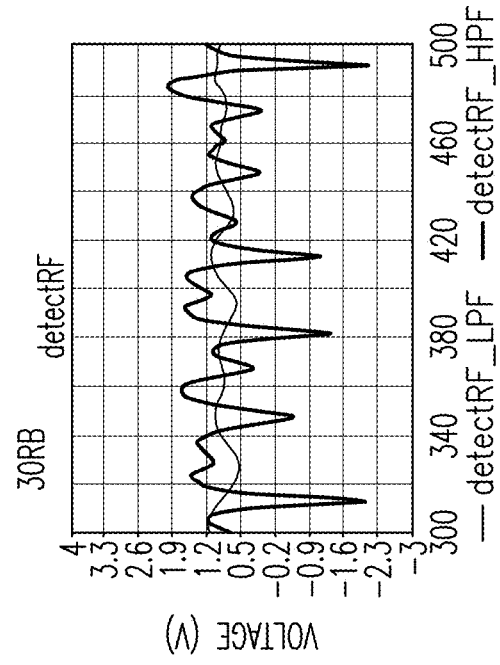
FIG. 14D is a graph of transient simulation results for one example of a detector detecting an RF signal with 40 RBs.

FIG. 14D is a graph of transient simulation results for one example of a detector detecting an RF signal with 40 RBs.

Figure 14E:
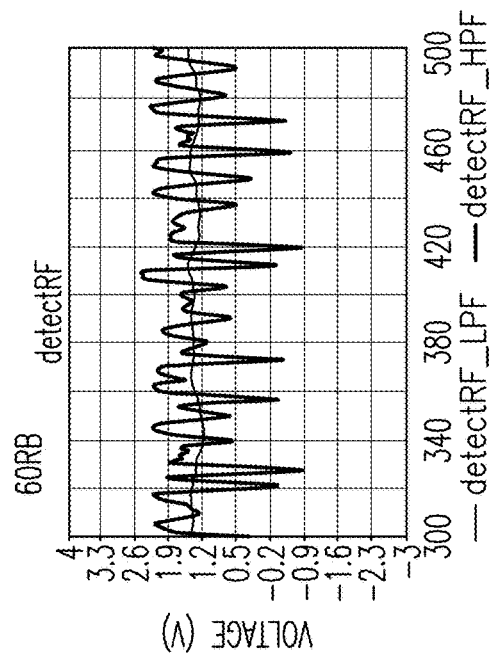
FIG. 14E is a graph of transient simulation results for one example of a detector detecting an RF signal with 50 RBs.

FIG. 14E is a graph of transient simulation results for one example of a detector detecting an RF signal with 50 RBs.

Figure 14F:
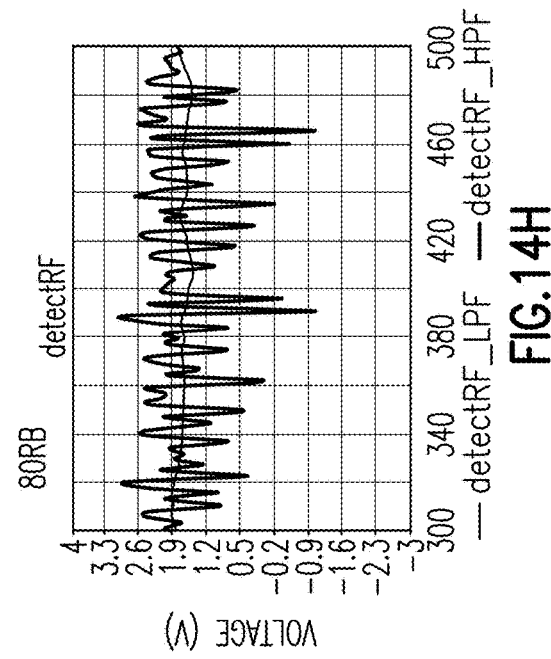
FIG. 14F is a graph of transient simulation results for one example of a detector detecting an RF signal with 60 RBs.

FIG. 14F is a graph of transient simulation results for one example of a detector detecting an RF signal with 60 RBs.

Figure 14G:
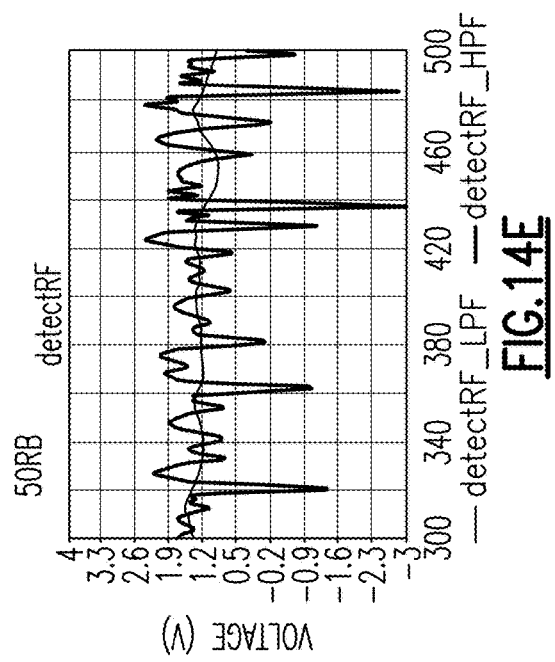
FIG. 14G is a graph of transient simulation results for one example of a detector detecting an RF signal with 70 RBs.

FIG. 14G is a graph of transient simulation results for one example of a detector detecting an RF signal with 70 RBs.

Figure 14H:
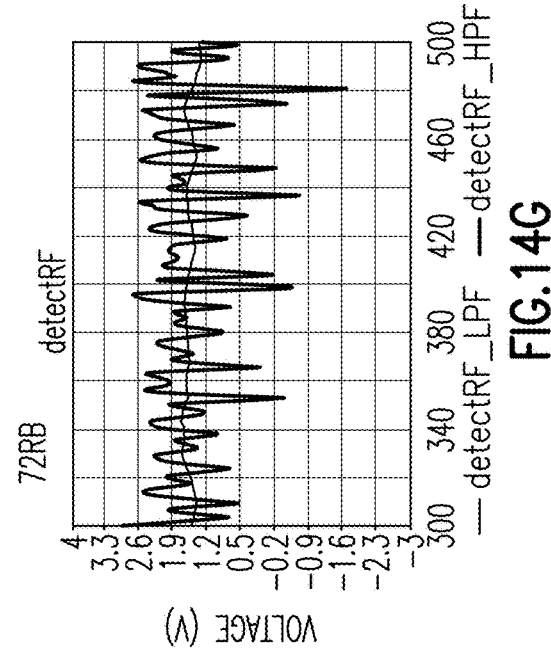
FIG. 14H is a graph of transient simulation results for one example of a detector detecting an RF signal with 80 RBs.

FIG. 14H is a graph of transient simulation results for one example of a detector detecting an RF signal with 80 RBs.

Figure 14J:
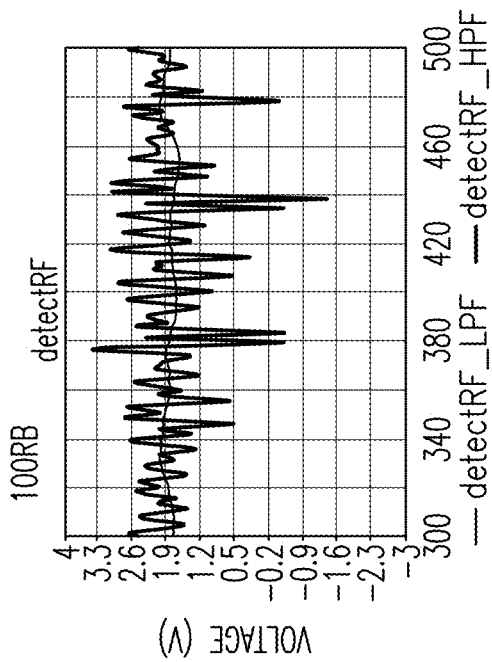
FIG. 14J is a graph of transient simulation results for one example of a detector detecting an RF signal with 100 RBs.
Figure 14I:
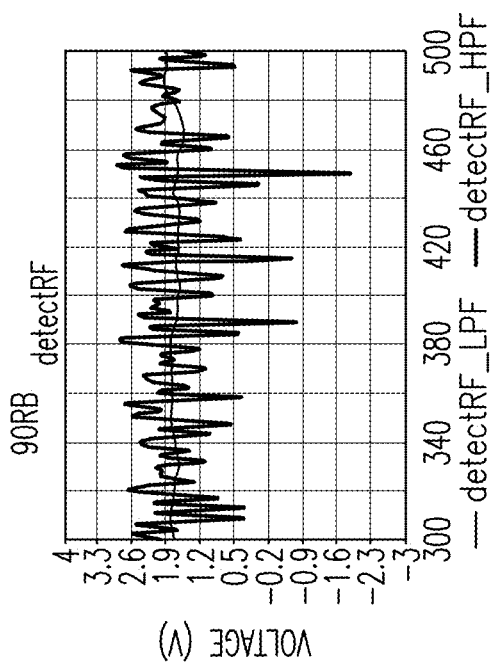
FIG. 14I is a graph of transient simulation results for one example of a detector detecting an RF signal with 90 RBs.

FIG. 14I is a graph of transient simulation results for one example of a detector detecting an RF signal with 90 RBs.

FIG. 14J is a graph of transient simulation results for one example of a detector detecting an RF signal with 100 RBs.

With reference to FIGS. 14A-14J, transient simulation results showing plots of detection signal voltage versus time are provided for one implementation of the detector 190 of FIG. 9. Plots are included for a high pass filtered detection signal (detectRF_HPF) outputted from the high pass filter 175 and a low pass filtered detection signal (detectRF_LPF) outputted from the low pass filter 176. The example results of FIGS. 14A-14J show that a comparison of the zero crossings of the high pass filtered detection signal to the zero crossings of the low pass filtered detection signal indicates the number of allocated RBs, which in turn indicates signal bandwidth.

Figure 15:
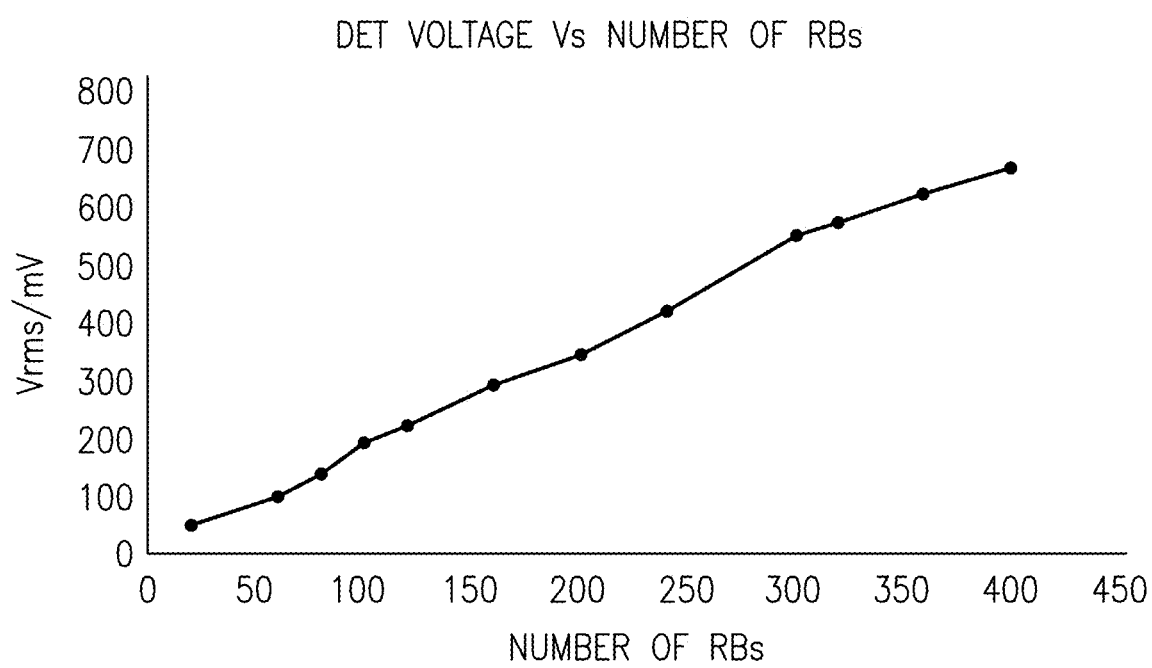
FIG. 15 is a graph of one example of detector voltage versus number of RBs.

FIG. 15 is a graph of one example of detector voltage versus number of RBs. The graph corresponds to simulation results for one implementation of the detector 190 of FIG. 9 in which the detector's output voltage is linearized using the signal detector linearization circuitry of FIGS. 11-12. In the example of FIG. 15, the detector voltage increase in relation to the number of RBs allocated to the RF signal. Additionally, detector voltage versus number of allocated RBs has a relatively linear slope.

Although various examples of simulations results have been shown in FIGS. 13A-15, simulation results can vary based on a number of factors, including, but not limited to, design implementation, simulation models, simulation parameters, and/or simulation tools. Accordingly, other results are possible.

Figure 16:
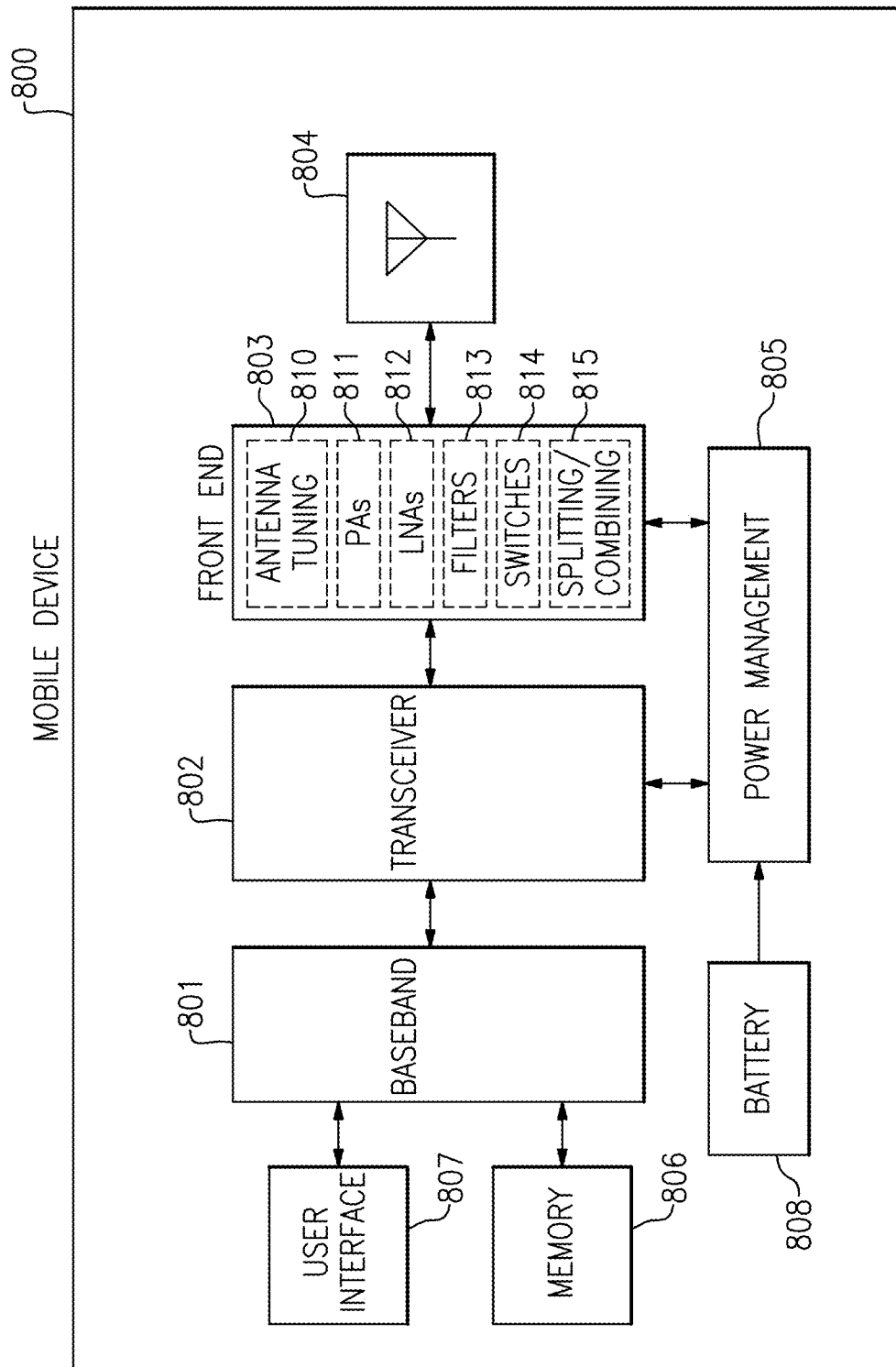
FIG. 16 is a schematic diagram of one embodiment of a mobile device.

FIG. 16 is a schematic diagram of one embodiment of a mobile device 800. The mobile device 800 includes a baseband system 801, a transceiver 802, a front end system 803, antennas 804, a power management system 805, a memory 806, a user interface 807, and a battery 808.

The mobile device 800 can be used communicate using a wide variety of communications technologies, including, but not limited to, 2G, 3G, 4G (including LTE, LTE-Advanced, and LTE-Advanced Pro), 5G NR, WLAN (for instance, WiFi), WPAN (for instance, Bluetooth and ZigBee), WMAN (for instance, WiMax), and/or GPS technologies.

The transceiver 802 generates RF signals for transmission and processes incoming RF signals received from the antennas 804. It will be understood that various functionalities associated with the transmission and receiving of RF signals can be achieved by one or more components that are collectively represented in FIG. 16 as the transceiver 802. In one example, separate components (for instance, separate circuits or dies) can be provided for handling certain types of RF signals.

The front end system 803 aids is conditioning signals transmitted to and/or received from the antennas 804. In the illustrated embodiment, the front end system 803 includes antenna tuning circuitry 810, power amplifiers (PAs) 811, low noise amplifiers (LNAs) 812, filters 813, switches 814, and signal splitting/combining circuitry 815. However, other implementations are possible.

For example, the front end system 803 can provide a number of functionalities, including, but not limited to, amplifying signals for transmission, amplifying received signals, filtering signals, switching between different bands, switching between different power modes, switching between transmission and receiving modes, duplexing of signals, multiplexing of signals (for instance, diplexing or triplexing), or some combination thereof.

In certain implementations, the mobile device 800 supports carrier aggregation, thereby providing flexibility to increase peak data rates. Carrier aggregation can be used for both Frequency Division Duplexing (FDD) and Time Division Duplexing (TDD), and may be used to aggregate a plurality of carriers or channels. Carrier aggregation includes contiguous aggregation, in which contiguous carriers within the same operating frequency band are aggregated. Carrier aggregation can also be non-contiguous, and can include carriers separated in frequency within a common band or in different bands.

The antennas 804 can include antennas used for a wide variety of types of communications. For example, the antennas 804 can include antennas for transmitting and/or receiving signals associated with a wide variety of frequencies and communications standards.

In certain implementations, the antennas 804 support MIMO communications and/or switched diversity communications. For example, MIMO communications use multiple antennas for communicating multiple data streams over a single radio frequency channel. MIMO communications benefit from higher signal to noise ratio, improved coding, and/or reduced signal interference due to spatial multiplexing differences of the radio environment. Switched diversity refers to communications in which a particular antenna is selected for operation at a particular time. For example, a switch can be used to select a particular antenna from a group of antennas based on a variety of factors, such as an observed bit error rate and/or a signal strength indicator.

The mobile device 800 can operate with beamforming in certain implementations. For example, the front end system 803 can include amplifiers having controllable gain and phase shifters having controllable phase to provide beam formation and directivity for transmission and/or reception of signals using the antennas 804. For example, in the context of signal transmission, the amplitude and phases of the transmit signals provided to the antennas 804 are controlled such that radiated signals from the antennas 804 combine using constructive and destructive interference to generate an aggregate transmit signal exhibiting beam-like qualities with more signal strength propagating in a given direction. In the context of signal reception, the amplitude and phases are controlled such that more signal energy is received when the signal is arriving to the antennas 804 from a particular direction. In certain implementations, the antennas 804 include one or more arrays of antenna elements to enhance beamforming.

The baseband system 801 is coupled to the user interface 807 to facilitate processing of various user input and output (I/O), such as voice and data. The baseband system 801 provides the transceiver 802 with digital representations of transmit signals, which the transceiver 802 processes to generate RF signals for transmission. The baseband system 801 also processes digital representations of received signals provided by the transceiver 802. As shown in FIG. 16, the baseband system 801 is coupled to the memory 806 of facilitate operation of the mobile device 800.

The memory 806 can be used for a wide variety of purposes, such as storing data and/or instructions to facilitate the operation of the mobile device 800 and/or to provide storage of user information.

The power management system 805 provides a number of power management functions of the mobile device 800. In certain implementations, the power management system 805 includes a PA supply control circuit that controls the supply voltages of the power amplifiers 811. For example, the power management system 805 can be configured to change the supply voltage(s) provided to one or more of the power amplifiers 811 to improve efficiency, such as power added efficiency (PAE).

As shown in FIG. 16, the power management system 805 receives a battery voltage from the battery 808. The battery 808 can be any suitable battery for use in the mobile device 800, including, for example, a lithium-ion battery.

Figure 17:
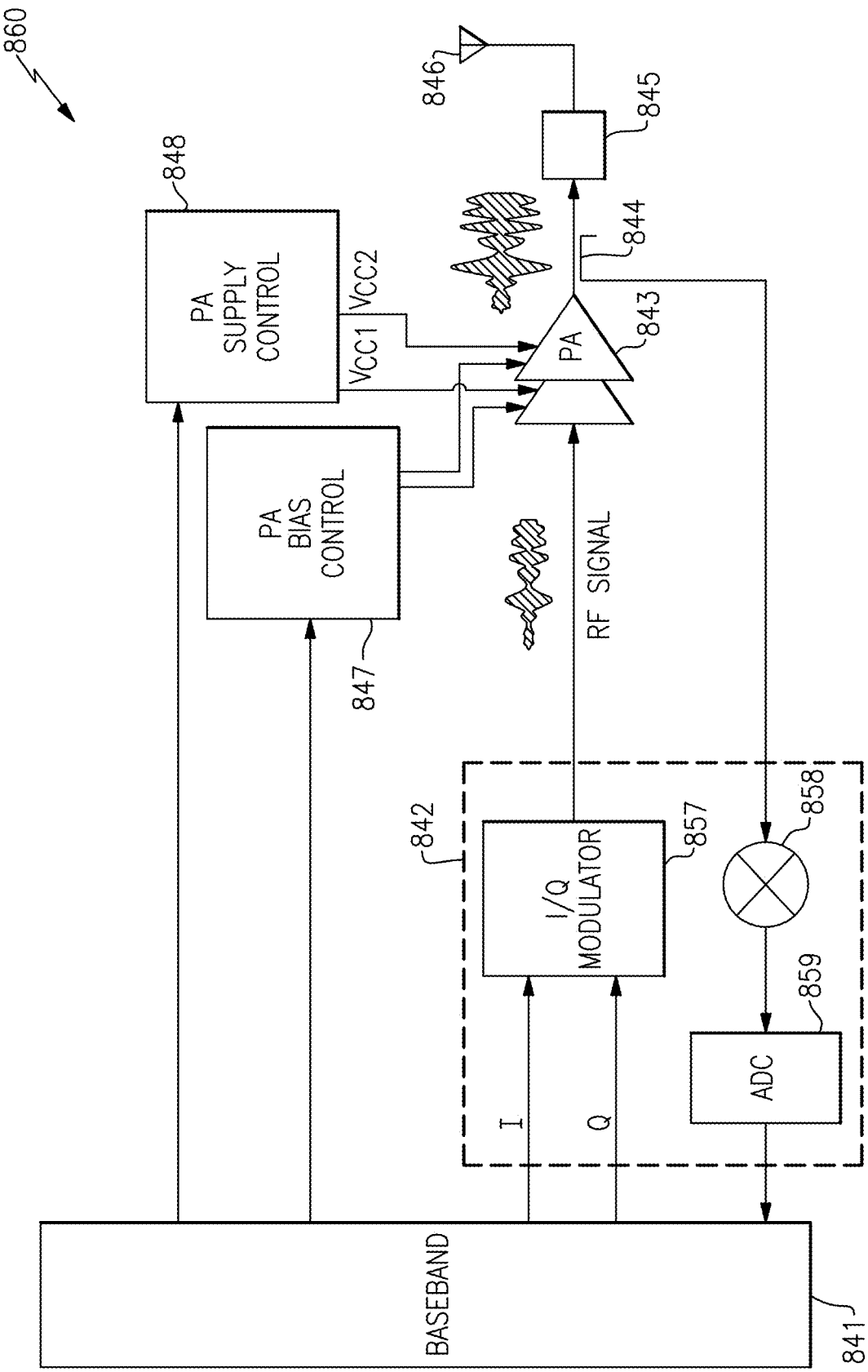
FIG. 17 is a schematic diagram of a power amplifier system according to one embodiment.

FIG. 17 is a schematic diagram of a power amplifier system 860 according to one embodiment. The illustrated power amplifier system 860 includes a baseband processor 841, a transmitter/observation receiver 842, a power amplifier (PA) 843, a directional coupler 844, front-end circuitry 845, an antenna 846, a PA bias control circuit 847, and a PA supply control circuit 848. The illustrated transmitter/observation receiver 842 includes an I/Q modulator 857, a mixer 858, and an analog-to-digital converter (ADC) 859. In certain implementations, the transmitter/observation receiver 842 is incorporated into a transceiver.

The baseband processor 841 can be used to generate an in-phase (I) signal and a quadrature-phase (Q) signal, which can be used to represent a sinusoidal wave or signal of a desired amplitude, frequency, and phase. For example, the I signal can be used to represent an in-phase component of the sinusoidal wave and the Q signal can be used to represent a quadrature-phase component of the sinusoidal wave, which can be an equivalent representation of the sinusoidal wave. In certain implementations, the I and Q signals can be provided to the I/Q modulator 857 in a digital format. The baseband processor 841 can be any suitable processor configured to process a baseband signal. For instance, the baseband processor 841 can include a digital signal processor, a microprocessor, a programmable core, or any combination thereof. Moreover, in some implementations, two or more baseband processors 841 can be included in the power amplifier system 860.

The I/Q modulator 857 can be configured to receive the I and Q signals from the baseband processor 841 and to process the I and Q signals to generate an RF signal. For example, the I/Q modulator 857 can include digital-to-analog converters (DACs) configured to convert the I and Q signals into an analog format, mixers for upconverting the I and Q signals to RF, and a signal combiner for combining the upconverted I and Q signals into an RF signal suitable for amplification by the power amplifier 843. In certain implementations, the I/Q modulator 857 can include one or more filters configured to filter frequency content of signals processed therein.

The power amplifier 843 can receive the RF signal from the I/Q modulator 857, and when enabled can provide an amplified RF signal to the antenna 846 via the front-end circuitry 845.

The front-end circuitry 845 can be implemented in a wide variety of ways. In one example, the front-end circuitry 845 includes one or more switches, filters, duplexers, multiplexers, and/or other components. In another example, the front-end circuitry 845 is omitted in favor of the power amplifier 843 providing the amplified RF signal directly to the antenna 846.

The directional coupler 844 senses an output signal of the power amplifier 823. Additionally, the sensed output signal from the directional coupler 844 is provided to the mixer 858, which multiplies the sensed output signal by a reference signal of a controlled frequency. The mixer 858 operates to generate a downshifted signal by downshifting the sensed output signal's frequency content. The downshifted signal can be provided to the ADC 859, which can convert the downshifted signal to a digital format suitable for processing by the baseband processor 841. Including a feedback path from the output of the power amplifier 843 to the baseband processor 841 can provide a number of advantages. For example, implementing the baseband processor 841 in this manner can aid in providing power control, compensating for transmitter impairments, and/or in performing digital pre-distortion (DPD). Although one example of a sensing path for a power amplifier is shown, other implementations are possible.

The PA supply control circuit 848 receives a power control signal from the baseband processor 841, and controls supply voltages of the power amplifier 843. In the illustrated configuration, the PA supply control circuit 848 generates a first supply voltage $V_{CC1}$ for powering an input stage of the power amplifier 843 and a second supply voltage $V_{CC2}$ for powering an output stage of the power amplifier 843. The PA supply control circuit 848 can control the voltage level of the first supply voltage $V_{CC1}$ and/or the second supply voltage $V_{CC2}$ to enhance the power amplifier system's PAE.

The PA supply control circuit 848 can employ various power management techniques to change the voltage level of one or more of the supply voltages over time to improve the power amplifier's power added efficiency (PAE), thereby reducing power dissipation.

One technique for improving efficiency of a power amplifier is average power tracking (APT), in which a DC-to-DC converter is used to generate a supply voltage for a power amplifier based on the power amplifier's average output power. Another technique for improving efficiency of a power amplifier is envelope tracking (ET), in which a supply voltage of the power amplifier is controlled in relation to the envelope of the RF signal. Thus, when a voltage level of the envelope of the RF signal increases the voltage level of the power amplifier's supply voltage can be increased. Likewise, when the voltage level of the envelope of the RF signal decreases the voltage level of the power amplifier's supply voltage can be decreased to reduce power consumption.

In certain configurations, the PA supply control circuit 848 is a multi-mode supply control circuit that can operate in multiple supply control modes including an APT mode and an ET mode. For example, the power control signal from the baseband processor 841 can instruct the PA supply control circuit 848 to operate in a particular supply control mode.

As shown in FIG. 17, the PA bias control circuit 847 receives a bias control signal from the baseband processor 841, and generates bias control signals for the power amplifier 843. In the illustrated configuration, the bias control circuit 847 generates bias control signals for both an input stage of the power amplifier 843 and an output stage of the power amplifier 843. However, other implementations are possible. The PA bias control circuit 847 can be implemented in accordance with any of the embodiments herein.

Figure 18A:
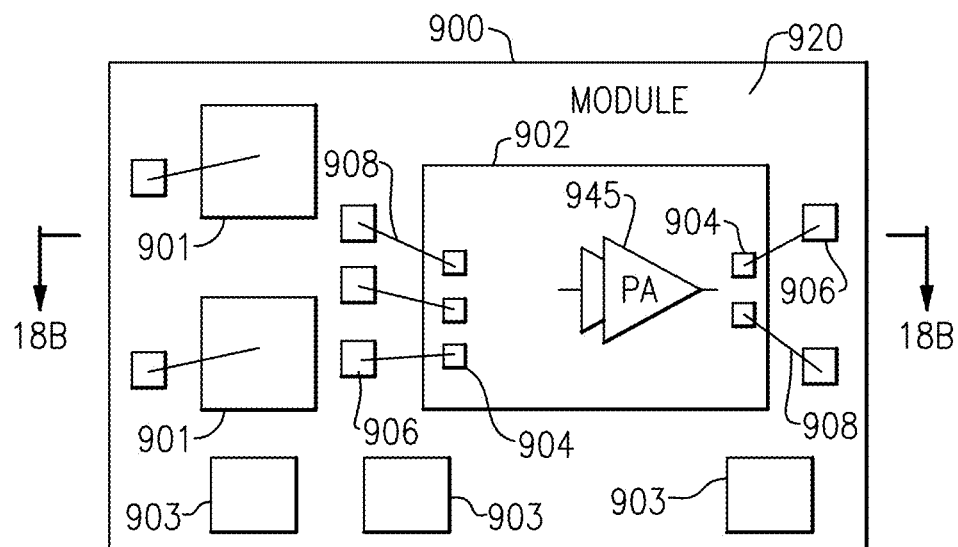
FIG. 18A is a schematic diagram of one embodiment of a packaged module.
Figure 18B:
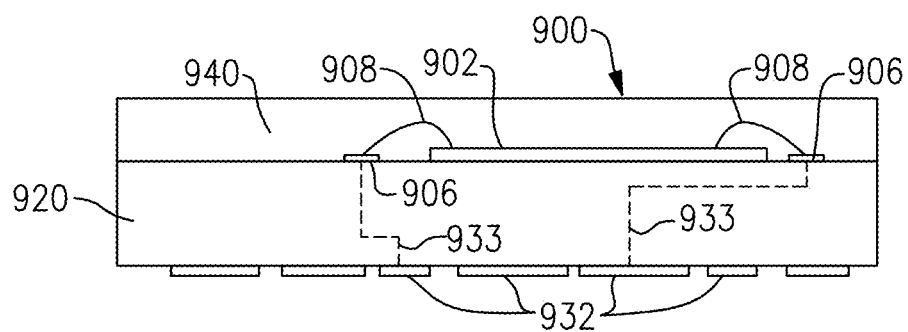
FIG. 18B is a schematic diagram of a cross-section of the packaged module of FIG. 18A taken along the lines 18B-18B.

FIG. 18A is a schematic diagram of one embodiment of a packaged module 900. FIG. 18B is a schematic diagram of a cross-section of the packaged module 900 of FIG. 18A taken along the lines 18B-18B.

The packaged module 900 includes radio frequency components 901, a semiconductor die 902, surface mount devices 903, wirebonds 908, a package substrate 920, and an encapsulation structure 940. The package substrate 920 includes pads 906 formed from conductors disposed therein. Additionally, the semiconductor die 902 includes pins or pads 904, and the wirebonds 908 have been used to connect the pads 904 of the die 902 to the pads 906 of the package substrate 920.

The semiconductor die 902 includes a power amplifier system 945, which can be implemented in accordance with any of the embodiments herein.

The packaging substrate 920 can be configured to receive a plurality of components such as radio frequency components 901, the semiconductor die 902 and the surface mount devices 903, which can include, for example, surface mount capacitors and/or inductors. In one implementation, the radio frequency components 901 include integrated passive devices (IPDs).

As shown in FIG. 18B, the packaged module 900 is shown to include a plurality of contact pads 932 disposed on the side of the packaged module 900 opposite the side used to mount the semiconductor die 902. Configuring the packaged module 900 in this manner can aid in connecting the packaged module 900 to a circuit board, such as a phone board of a mobile device. The example contact pads 932 can be configured to provide radio frequency signals, bias signals, and/or power (for example, a power supply voltage and ground) to the semiconductor die 902 and/or other components. As shown in FIG. 18B, the electrical connections between the contact pads 932 and the semiconductor die 902 can be facilitated by connections 933 through the package substrate 920. The connections 933 can represent electrical paths formed through the package substrate 920, such as connections associated with vias and conductors of a multilayer laminated package substrate.

In some embodiments, the packaged module 900 can also include one or more packaging structures to, for example, provide protection and/or facilitate handling. Such a packaging structure can include overmold or encapsulation structure 940 formed over the packaging substrate 920 and the components and die(s) disposed thereon.

It will be understood that although the packaged module 900 is described in the context of electrical connections based on wirebonds, one or more features of the present disclosure can also be implemented in other packaging configurations, including, for example, flip-chip configurations.

Applications

Some of the embodiments described above have provided examples in connection with wireless devices or mobile phones. However, the principles and advantages of the embodiments can be used for any other systems or apparatus that have needs for power amplifiers.

Such power amplifiers can be implemented in various electronic devices. Examples of the electronic devices can include, but are not limited to, consumer electronic products, parts of the consumer electronic products, electronic test equipment, etc. Examples of the electronic devices can also include, but are not limited to, memory chips, memory modules, circuits of optical networks or other communication networks, and disk driver circuits. The consumer electronic products can include, but are not limited to, a mobile phone, a telephone, a television, a computer monitor, a computer, a hand-held computer, a personal digital assistant (PDA), a microwave, a refrigerator, an automobile, a stereo system, a cassette recorder or player, a DVD player, a CD player, a VCR, an MP3 player, a radio, a camcorder, a camera, a digital camera, a portable memory chip, a washer, a dryer, a washer/dryer, a copier, a facsimile machine, a scanner, a multi-functional peripheral device, a wrist watch, a clock, etc. Further, the electronic devices can include unfinished products.

CONCLUSION

Unless the context clearly requires otherwise, throughout the description and the claims, the words "comprise," "comprising," and the like are to be construed in an inclusive sense, as opposed to an exclusive or exhaustive sense; that is to say, in the sense of "including, but not limited to." The word "coupled," as generally used herein, refers to two or more elements that may be either directly connected, or connected by way of one or more intermediate elements. Likewise, the word "connected", as generally used herein, refers to two or more elements that may be either directly connected, or connected by way of one or more intermediate elements. Additionally, the words "herein," "above," "below," and words of similar import, when used in this application, shall refer to this application as a whole and not to any particular portions of this application. Where the context permits, words in the above Detailed Description using the singular or plural number may also include the plural or singular number respectively. The word "or" in reference to a list of two or more items, that word covers all of the following interpretations of the word: any of the items in the list, all of the items in the list, and any combination of the items in the list.

Moreover, conditional language used herein, such as, among others, "can," "could," "might," "can," "e.g.," "for example," "such as" and the like, unless specifically stated otherwise, or otherwise understood within the context as used, is generally intended to convey that certain embodiments include, while other embodiments do not include, certain features, elements and/or states. Thus, such conditional language is not generally intended to imply that features, elements and/or states are in any way required for one or more embodiments or that one or more embodiments necessarily include logic for deciding, with or without author input or prompting, whether these features, elements and/or states are included or are to be performed in any particular embodiment.

The above detailed description of embodiments of the invention is not intended to be exhaustive or to limit the invention to the precise form disclosed above. While specific embodiments of, and examples for, the invention are described above for illustrative purposes, various equivalent modifications are possible within the scope of the invention, as those skilled in the relevant art will recognize. For example, while processes or blocks are presented in a given order, alternative embodiments may perform routines having steps, or employ systems having blocks, in a different order, and some processes or blocks may be deleted, moved, added, subdivided, combined, and/or modified. Each of these processes or blocks may be implemented in a variety of different ways. Also, while processes or blocks are at times shown as being performed in series, these processes or blocks may instead be performed in parallel, or may be performed at different times.

The teachings of the invention provided herein can be applied to other systems, not necessarily the system described above. The elements and acts of the various embodiments described above can be combined to provide further embodiments.

While certain embodiments of the inventions have been described, these embodiments have been presented by way of example only, and are not intended to limit the scope of the disclosure. Indeed, the novel methods and systems described herein may be embodied in a variety of other forms; furthermore, various omissions, substitutions and changes in the form of the methods and systems described herein may be made without departing from the spirit of the disclosure. The accompanying claims and their equivalents are intended to cover such forms or modifications as would fall within the scope and spirit of the disclosure.

What is claimed is:

1. A power amplifier system comprising:
   a power amplifier configured to provide amplification to a radio frequency signal, the power amplifier biased by a bias signal;

a detector configured to generate a baseband detection signal based on the radio frequency signal, and to process the baseband detection signal to generate a high pass detection signal and a low pass detection signal, the detector further configured to generate a bandwidth signal based on a comparison of the high pass detection signal to the low pass detection signal; and a power amplifier bias control circuit configured to generate the bias signal based on the bandwidth signal wherein the power amplifier bias control circuit includes a bias circuit configured to generate a bias input signal and a controllable filter configured to filter the bias input signal to generate the bias signal of the power amplifier, the controllable filter controlled by the bandwidth signal.

2. The power amplifier system of claim 1 further comprising an analog to digital converter configured to generate a digital control signal for the controllable filter based on the bandwidth signal.

3. The power amplifier system of claim 2 wherein the controllable filter includes a plurality of selectable capacitors that are selected based on a value of the digital control signal.

4. The power amplifier system of claim 1 wherein the detector is configured to generate the bandwidth signal based on comparing a number of zero crossing of the high pass detection signal to a number of zero crossings of the low pass detection signal.

5. The power amplifier system of claim 1 wherein a bandwidth of the power amplifier bias control circuit is configured to widen in response to the bandwidth signal indicating an increase in a bandwidth of the radio frequency signal.

6. The power amplifier system of claim 1 wherein the detector includes a root mean square detector configured to generate the baseband detection signal to indicate a root mean square value of the radio frequency signal.

7. The power amplifier system of claim 1 further comprising a directional coupler configured to receive the radio frequency signal and to provide a coupled signal to an input of the detector.

8. A mobile device comprising:

a transceiver configured to generate a radio frequency signal; and a front end system including a power amplifier configured to amplify the radio frequency signal and biased by a bias signal, and a detector configured to generate a baseband detection signal based on the radio frequency signal and to process the baseband detection signal to generate a high pass detection signal and a low pass detection signal, the detector further configured to generate a bandwidth signal based on a comparison of the high pass detection signal to the low pass detection signal, the front end system further including a power amplifier bias control circuit configured to generate the bias signal based on the bandwidth signal wherein the power amplifier bias control circuit includes a bias circuit configured to generate a bias input signal and a controllable filter configured to filter the bias input signal to generate the bias signal of the power amplifier, the controllable filter controlled by the bandwidth signal.

9. The mobile device of claim 8 further comprising an antenna configured to transmit a radio frequency output signal from the power amplifier.

10. The mobile device of claim 8 wherein the controllable filter includes a plurality of selectable capacitors that are selected based on the bandwidth signal.

11. The mobile device of claim 8 wherein the detector is configured to generate the bandwidth signal based on comparing a number of zero crossing of the high pass detection signal to a number of zero crossings of the low pass detection signal.

12. The mobile device of claim 8 wherein a bandwidth of the power amplifier bias control circuit is configured to widen in response to the bandwidth signal indicating an increase in a bandwidth of the radio frequency signal.

13. The mobile device of claim 8 wherein the detector includes a root mean square detector configured to generate the baseband detection signal to indicate a root mean square value of the radio frequency signal.

14. The mobile device of claim 8 wherein the front end system further includes a directional coupler configured to receive the radio frequency signal and to provide a coupled signal to an input of the detector.

15. A method of power amplifier biasing, the method comprising:

amplifying a radio frequency signal using a power amplifier;

generating a baseband detection signal based on the radio frequency signal using a detector;

processing the baseband detection signal to generate a high pass detection signal and a low pass detection signal using the detector;

generating a bandwidth signal based on a comparison of the high pass detection signal to the low pass detection signal using the detector; and generating a bias signal for the power amplifier based on the bandwidth signal using a power amplifier bias control circuit wherein generating the bias signal includes generating a bias input signal using a bias circuit, filter the bias input signal to generate the bias signal of the power amplifier using a controllable filter, and controlling the controllable filter using the bandwidth signal.

16. The method of claim 15 wherein generating the bandwidth signal includes comparing a number of zero crossing of the high pass detection signal to a number of zero crossings of the low pass detection signal.

17. The method of claim 15 further comprising widening a bandwidth of the power amplifier bias control circuit in response to the bandwidth signal indicating an increase in a bandwidth of the radio frequency signal.

* * * * *